(12) United States Patent
Dai et al.

(10) Patent No.: US 11,943,984 B2
(45) Date of Patent: Mar. 26, 2024

(54) DISPLAY SUBSTRATE, DISPLAY PANEL AND DISPLAY DEVICE

(71) Applicants: Chengdu BOE Optoelectronics Technology Co., Ltd., Sichuan (CN); BOE Technology Group Co., Ltd., Beijing (CN)

(72) Inventors: Jie Dai, Beijing (CN); De Li, Beijing (CN); Pengfei Yu, Beijing (CN); Tinghua Shang, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 474 days.

(21) Appl. No.: 17/297,838

(22) PCT Filed: Jul. 15, 2020

(86) PCT No.: PCT/CN2020/102031
§ 371 (c)(1),
(2) Date: May 27, 2021

(87) PCT Pub. No.: WO2022/011582
PCT Pub. Date: Jan. 20, 2022

(65) Prior Publication Data
US 2022/0310708 A1    Sep. 29, 2022

(51) Int. Cl.
*H10K 59/35* (2023.01)
*H10K 59/121* (2023.01)
*H10K 59/122* (2023.01)
*H10K 59/131* (2023.01)

(52) U.S. Cl.
CPC ....... *H10K 59/353* (2023.02); *H10K 59/1213* (2023.02); *H10K 59/1216* (2023.02); *H10K 59/122* (2023.02); *H10K 59/131* (2023.02)

(58) Field of Classification Search
CPC .. H10K 59/353; H10K 59/131; H10K 59/122; H10K 59/1213; H10K 59/1216
USPC .......................................................... 257/40
See application file for complete search history.

(56) References Cited

U.S. PATENT DOCUMENTS

| | | | | |
|---|---|---|---|---|
| 2019/0103455 A1* | 4/2019 | Song | .................... | H10K 59/131 |
| 2021/0074783 A1* | 3/2021 | Kang | ................ | H01L 29/78651 |
| 2022/0077419 A1* | 3/2022 | Hwang | .................. | H05K 1/189 |
| 2022/0115480 A1* | 4/2022 | Park | .................. | H10K 59/1213 |

* cited by examiner

*Primary Examiner* — Xia L Cross
(74) *Attorney, Agent, or Firm* — WHDA, LLP

(57) ABSTRACT

A display substrate includes: a base substrate; a plurality of sub-pixels, each sub-pixel including a light-emission device including a first electrode; a plurality of signal lines including at least a first signal line and a second signal line; a signal line lead in a non-display area; and a signal line transfer structure on the base substrate, wherein the signal line transfer structure is configured to connect the signal line lead and the second signal line, the signal line transfer structure and the first signal line are located in the same layer, and the signal line transfer structure is spaced apart from the first signal line. An orthographic projection of the first electrode of at least one of the sub-pixels on the base substrate at least partially overlaps with an orthographic projection of each of the first signal line and the signal line transfer structure on the base substrate.

21 Claims, 22 Drawing Sheets

DISPLAY SUBSTRATE, DISPLAY PANEL AND DISPLAY DEVICE

CROSS REFERENCE TO RELATED APPLICATION(S)

This application is a Section 371 National Stage Application of International Application No. PCT/CN2020/102031, filed on Jul. 15, 2020, entitled "DISPLAY SUBSTRATE, DISPLAY PANEL AND DISPLAY DEVICE", the contents of which are incorporated herein by reference in its entirety.

TECHNICAL FIELD

The present disclosure relates to the field of display technology, and in particular to a display substrate, a display panel and a display device.

BACKGROUND

An organic light-emission diode (abbreviated as OLED) display device is a type of display device that uses a light-emission OLED to display information such as images. The OLED display device has characteristics such as low power consumption, high brightness, and high response speed. With the development of OLED technology, requirements for display effects are getting higher and higher, so that it is required to improve continuously performance parameters such as color shift. There are many factors that affect the color shift of a product. From the perspective of substrate design, the plainness of planarization layers or pixel electrodes has a great influence on the color shift.

The above information is only used to understand the background of the technical idea of the present disclosure. Therefore, the above information may include information that does not constitute the existing art.

SUMMARY

In one aspect, the present disclosure relates to a display substrate, the display substrate includes a display area and a non-display area, wherein the display substrate includes: a base substrate; a plurality of sub-pixels in the display area, wherein the plurality of sub-pixels are arranged on the base substrate in an array in a row direction and a column direction, each sub-pixel includes a light-emission device, and the light-emission device includes a first electrode; a plurality of signal lines on the base substrate, wherein the plurality of signal lines include at least a first signal line and a second signal line, the first signal line is configured to transmit a voltage signal, and the second signal line is configured to transmit a scan signal; a signal line lead on the base substrate, wherein the signal line lead is located in the non-display area; and a signal line transfer structure on the base substrate, wherein the signal line transfer structure is configured to connect the signal line lead and the second signal line, wherein the signal line transfer structure and the first signal line are located in the same layer, and the signal line transfer structure is spaced apart from the first signal line; and wherein an orthographic projection of the first electrode of at least one of the sub-pixels on the base substrate at least partially overlaps with an orthographic projection of the first signal line on the base substrate, and the orthographic projection of the first electrode of at least one of the sub-pixels on the base substrate at least partially overlaps with an orthographic projection of the signal line transfer structure on the base substrate.

According to some exemplary embodiments, the plurality of sub-pixels include at least one array of edge sub-pixels at an edge position of the display area close to the non-display area; an orthographic projection of the first electrode of each edge sub-pixel in the at least one array of edge sub-pixels on the base substrate at least partially overlaps with the orthographic projection of the first signal line on the base substrate, and the orthographic projection of the first electrode of each edge sub-pixel in the at least one array of edge sub-pixels on the base substrate at least partially overlaps with the orthographic projection of the signal line transfer structure on the base substrate.

According to some exemplary embodiments, the at least one array of edge sub-pixels include at least one column of edge sub-pixels, and the at least one column of edge sub-pixels are arranged in a direction that is substantially the same as an extending direction of the first signal line.

According to some exemplary embodiments, an extending direction of the signal line transfer structure and the extending direction of the first signal line are substantially the same, and the plurality of signal line transfer structures are arranged in the direction that is substantially the same as the extending direction of the first signal line.

According to some exemplary embodiments, an orthographic projection of the signal line transfer structure, overlapping with an edge sub-pixel in the at least one array of edge sub-pixels, on the base substrate passes through an orthographic projection of the first electrode of the edge sub-pixel on the base substrate.

According to some exemplary embodiments, the display substrate further includes a pixel defining layer on a side of the first electrode away from the base substrate, the pixel defining layer includes an opening, the first electrode of the at least one sub-pixel is at least partially exposed by the opening, and a size of the signal line transfer structure in the column direction is greater than a size of the opening of the pixel defining layer corresponding to the at least one sub-pixel in the column direction.

According to some exemplary embodiments, a size of a pixel driving circuit corresponding to the at least one sub-pixel in the column direction is marked as a, and the size of the signal line transfer structure in the column direction is between ⅓a and a.

According to some exemplary embodiments, in a direction perpendicular to the first signal line, the signal line transfer structure is located on a side of the first signal line close to the non-display area.

According to some exemplary embodiments, the first electrode of each edge sub-pixel in the at least one array of edge sub-pixels includes a first edge portion close to the non-display area, and an orthographic projection of the first edge portion on the base substrate at least partially overlaps with the orthographic projection of the signal line transfer structure on the base substrate.

According to some exemplary embodiments, the first electrode of each edge sub-pixel in the at least one array of edge sub-pixels includes a second edge portion away from the non-display area, and an orthographic projection of the second edge portion on the base substrate at least partially overlaps with the orthographic projection of the first signal line on the base substrate.

According to some exemplary embodiments, a thickness of the signal line transfer structure in a direction perpendicular to the base substrate is substantially equal to a thickness of the first signal line in the direction perpendicular to the base substrate.

According to some exemplary embodiments, the first electrode includes a body portion, and an orthographic projection of the body portion on the base substrate has a regular shape; and the orthographic projection of the first signal line on the base substrate and the orthographic projection of the signal line transfer structure on the base substrate are respectively located on two sides of a center of the orthographic projection of the body portion of the first electrode on the base substrate.

According to some exemplary embodiments, the display substrate further includes a planarization layer, and the planarization layer is located between a layer where the first electrode is located and a layer where both the signal line transfer structure and the first signal line are located.

According to some exemplary embodiments, each sub-pixel further includes a pixel driving circuit, the pixel driving circuit includes a storage capacitor and at least one thin film transistor, each thin film transistor includes a semiconductor layer, a gate electrode, a source electrode and a drain electrode, and the storage capacitor includes a first capacitor electrode and a second capacitor electrode; and wherein the display substrate further includes: a first conductive layer on a side of the semiconductor layer away from the base substrate, wherein the gate electrode and the first capacitor electrode are located in the first conductive layer; a second conductive layer on a side of the first conductive layer away from the base substrate, wherein the second capacitor electrode is located in the second conductive layer; and a third conductive layer on a side of the second conductive layer away from the base substrate, wherein the source electrode and the drain electrode are located in the third conductive layer.

According to some exemplary embodiments, the signal line transfer structure and the first signal line are located in one of the first conductive layer, the second conductive layer, or the third conductive layer.

According to some exemplary embodiments, the display substrate further includes a conductive connecting portion between the third conductive layer and a layer where the first electrode is located, and the conductive connecting portion is configured to electrically connect one of the source electrode and the drain electrode with the first electrode.

According to some exemplary embodiments, the signal line transfer structure and the first signal line are located in a layer where the conductive connecting portion is located.

According to some exemplary embodiments, at least one of the signal line lead and the second signal line is located in a layer different from a layer where the signal line transfer structure is located.

According to some exemplary embodiments, the signal line lead and the second signal line are located in the same layer, both the signal line lead and the second signal line are located in a layer different from a layer where the signal line transfer structure is located; the display substrate further includes an insulating layer between a layer where both the signal line lead and the second signal line are located and the layer where the signal line transfer structure is located, and the insulating layer includes a first via hole and a second via hole; a part of the signal line transfer structure is connected to the second signal line through a first conductive plug in the first via hole, another part of the signal line transfer structure is connected to the signal line lead through a second conductive plug in the second via hole; or, the signal line lead and the second signal line are located in different layers, and the signal line lead and the signal line transfer structure are located in the same layer; the display substrate further includes an insulating layer between a layer where both the signal line lead and the signal line transfer structure are located and a layer where the second signal line is located, and the insulating layer includes a first via hole; a part of the signal line transfer structure is connected to the second signal line through a first conductive plug in the first via hole, and another part of the signal line transfer structure is directly connected to the signal line lead; or, the signal line lead and the second signal line are located in different layers, and the second signal line and the signal line transfer structure are located in the same layer; the display substrate further includes an insulating layer between a layer where both the second signal line and the signal line transfer structure are located and a layer where the signal line lead is located, and the insulating layer includes a second via hole; a part of the signal line transfer structure is directly connected to the second signal line, and another part of the signal line transfer structure is connected to the signal line lead through a second conductive plug in the second via hole.

According to some exemplary embodiments, the display substrate further includes a gate driving circuit arranged on the base substrate and located in the non-display area, the signal line lead includes a signal output line of the gate driving circuit, the signal output line is configured to output a gate scan signal, and the second signal line includes a scan signal line for transmitting the gate scan signal.

According to some exemplary embodiments, the display substrate further includes an initializing voltage signal line arranged on the base substrate and located in the non-display area, the signal output line is electrically connected to the signal line transfer structure through a plurality of third via holes, and the plurality of third via holes are arranged in a direction parallel to an extending direction of the initializing voltage signal line.

According to some exemplary embodiments, the scan signal line is electrically connected to the signal line transfer structure through a plurality of fourth via holes, and the plurality of fourth via holes are arranged in a direction perpendicular to the extending direction of the initializing voltage signal line.

According to some exemplary embodiments, the signal line transfer structure includes a widened portion, orthographic projections of the plurality of third via holes and orthographic projections of the plurality of fourth via holes on the base substrate all fall within an orthographic projection of the widened portion on the base substrate; and an orthographic projection of the first edge portion of the first electrode on the base substrate at least partially overlaps with the orthographic projection of the widened portion of the signal line transfer structure on the base substrate.

According to some exemplary embodiments, the first signal line includes a driving voltage line for transmitting a driving voltage, and an orthographic projection of the second edge portion of the first electrode on the base substrate at least partially overlaps with an orthographic projection of the driving voltage line on the base substrate.

According to some exemplary embodiments, the first signal line further includes a data line for transmitting a data signal, and the orthographic projection of the second edge portion of the first electrode on the base substrate also at least partially overlaps with an orthographic projection of the data line on the base substrate.

According to some exemplary embodiments, the scan signal line is located in the first conductive layer, the signal output line is located in the second conductive layer, and the signal line transfer structure is located in the third conductive layer.

According to some exemplary embodiments, the display substrate further includes a reset control signal line on the base substrate, the reset control signal line is electrically connected to the signal line transfer structure through a plurality of fifth via holes, and the plurality of fifth via holes are arranged in a direction perpendicular to the extending direction of the initializing voltage signal line.

According to some exemplary embodiments, the signal output line comprises a first sub-section of signal output line, a second sub-section of signal output line, and a third sub-section of signal output line that are sequentially connected, an orthographic projection of the first sub-section of signal output line on the base substrate falls within the orthographic projection of the signal line transfer structure on the base substrate, an orthographic projection of the second sub-section of signal output line on the base substrate at least partially overlaps with an orthographic projection of the initializing voltage signal line on the base substrate, and the third sub-section of signal output line is located on a side of the initializing voltage signal line away from the signal line transfer structure; and in a direction parallel to the extending direction of the initializing voltage signal line, a size of the second sub-section of signal output line is smaller than a size of the first sub-section of signal output line, and the size of the first sub-section of signal output line is smaller than a size of the third sub-section of signal output line.

According to some exemplary embodiments, the second capacitor electrode comprises a second capacitor electrode body portion and a second capacitor electrode connecting portion, and the second capacitor electrode connecting portion is located between two adjacent second capacitor electrode body portions; a projection of the second sub-section of signal output line in the direction perpendicular to the extending direction of the initializing voltage signal line at least partially overlaps with a projection of the second capacitor electrode connecting portion in the direction perpendicular to the extending direction of the initializing voltage signal line.

According to some exemplary embodiments, the display substrate further includes an another initializing voltage signal line arranged on the base substrate and located in the non-display area, the another initializing voltage signal line and the first electrode are located in the same layer; and the another initializing voltage signal line is electrically connected to the initializing voltage signal line.

According to some exemplary embodiments, the display substrate further includes an initializing voltage line on the base substrate, the initializing voltage signal line is electrically connected to the initializing voltage line through a plurality of sixth via holes, and the plurality of sixth via holes are arranged in a direction parallel to the extending direction of the initializing voltage signal line.

According to some exemplary embodiments, the light-emission device includes an organic light-emission diode, and the first electrode is an anode of the organic light-emission diode.

According to some exemplary embodiments, the at least one array of edge sub-pixels includes a plurality of red sub-pixels and a plurality of blue sub-pixels alternately arranged in the column direction.

In another aspect, the present disclosure relates to a display panel, the display panel includes the display substrate as mentioned above.

In another aspect, the present disclosure relates to a display device, the display device includes the display substrate or the display panel as mentioned above.

BRIEF DESCRIPTION OF THE DRAWINGS

By describing exemplary embodiments of the present disclosure in detail with reference to the drawings, the features and advantages of the present disclosure will become more apparent.

DETAILED DESCRIPTION OF EMBODIMENTS

Figure 1:
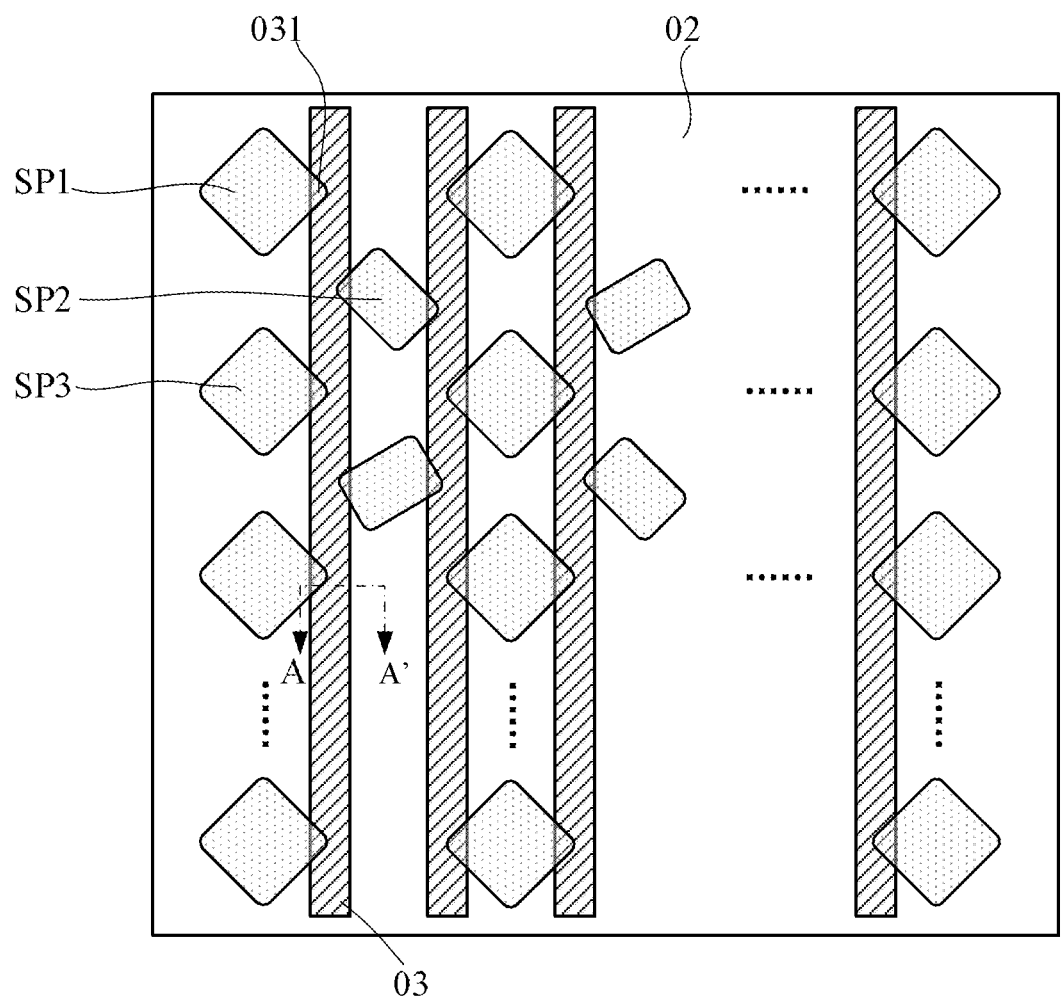
FIG. 1 is a partial plan schematic view of an OLED display substrate in the related art.

In order to make the purpose, technical solutions and advantages of the embodiments of the present disclosure apparent, the technical solutions in the embodiments of the present disclosure will be clearly and completely described in conjunction with the drawings in the embodiments of the present disclosure. The affirmatively described embodiments constitute only a subset of the embodiments contemplated in view of the present disclosure, and not all of such embodiments. Based on the described embodiments of the present disclosure, further embodiments obtained by those skilled in the art without creative work are within the protection scope of the present disclosure.

It should be noted that, in the drawings, for clarity and/or description purposes, a size and relative size of an element may be enlarged, the size and relative size of each element need not be limited to those shown in the drawings. In the specification and drawings, the same or similar reference numerals indicate the same or similar components.

When an element is described as being "on", "connected to" or "coupled to" another element, the element may be directly on the another element, directly connected to the another element or directly coupled to the another element, or an intermediate element may be present. However, when an element is described as being "directly on", "directly connected to" or "directly coupled to" another element, there are no intermediate element. Other terms and/or expressions used to describe the relationship between elements should be interpreted in a similar manner, for example, "between" and "directly between", "adjacent" and "directly adjacent", "on" and "directly on" etc. In addition, the term "connect" may refer to a physical connection, an electrical connection, a communication connection, and/or a fluid connection. In addition, X axis, Y axis, and Z axis are not limited to the three axes of the Cartesian coordinate system, which may be interpreted in broader meaning. For example, the X axis, the Y axis, and the Z axis may be perpendicular to each other, or may represent different directions that are not perpendicular to each other. For the purpose of the present disclosure, "at least one of X, Y, and Z" and "at least one selected from a group consisting of X, Y, and Z" may be interpreted as only X, only Y, only Z, or any combination of two or more of X, Y, and Z such as XYZ, XYY, YZ, and ZZ. As shown in the present disclosure, the term "and/or" includes any and all combinations of one or more of the related items.

It should be noted that although the terms "first", "second", etc. may be used to describe various components, members, elements, regions, layers and/or portions, these components, components, elements, regions, layers and/or portions should not be limited by these terms. Actually, the terms are used to distinguish one component, member, element, region, layer, and/or portion from another one. Thus, for example, a first component, a first member, a first element, a first region, a first layer, and/or a first portion described below may be referred to as a second component, a second member, a second element, a second region, a second layer and/or a second portion, which does not depart from the teachings of this disclosure.

For the convenience of description, the spatial relationship terms, for example, "upper", "lower", "left", "right", etc. may be used to describe the relationship between one element or feature and another element or feature as shown in figures. It should be understood that, in addition to an orientation described in figures, the spatial relationship terms include other different orientations of a device in operation. For example, if the device in figures is turned upside down, elements described as "below" or "lower" other elements or features will be oriented "on" or "upper" other elements or features.

In the present disclosure, the terms "substantially", "approximately", "circa", "about" and other similar terms are used as approximate terms rather than as terms of degree, and these terms explain a inherent deviation of a measured value or a calculated value recognized by those skilled in the art. Taking into factors such as process fluctuations, measurement problems, and errors related to the measurement of specific quantities (i.e. the limitations of the measurement system), the "substantially" or "approximately" includes a stated value and means that a specific value determined by those skilled in the art is within an acceptable deviation range. For example, "approximately" may mean within one or more standard deviations, or within ±30%, ±20%, ±10%, ±5% of the stated value.

It should be noted that, in the present disclosure, the expression "same layer" refers to a film layer formed by the same film forming process, wherein the film layer is used to form a specific pattern, and then the same mask is used to pattern the film layer and form a layer structure through one patterning process. Depending on the specific pattern, the one patterning process may include multiple exposure, development or etching processes, and the specific pattern in the formed layer structure may be continuous or discontinuous. That is, a plurality of elements, components, structures and/or portions located in the "same layer" are made of the same material and formed by the same patterning process. Generally, the plurality of elements, components, structures and/or portions located in the "same layer" have approximately the same thickness.

Those skilled in the art should understand that, in the present disclosure, unless otherwise specified, the expression "height" or "thickness" refers to a size along a surface of each film layer arranged perpendicular to a display substrate, that is, the size in a light-emission direction of the display substrate, or the size in a normal direction of the display device.

The embodiments of the present disclosure relate to at least one display substrate, the display substrate includes a display area and a non-display area, wherein the display substrate includes: a base substrate; a plurality of sub-pixels, wherein the plurality of sub-pixels are arranged on the base substrate in an array in a row direction and a column direction, the plurality of sub-pixels is located in the display area, each sub-pixel includes a light-emission device, and the light-emission device includes a first electrode; a plurality of signal lines on the base substrate, wherein the plurality of signal lines include at least a first signal line and a second signal line, the first signal line is configured to transmit a voltage signal, and the second signal line is configured to transmit a scan signal; a signal line lead on the base substrate, wherein the signal line lead is located in the non-display area; and a signal line transfer structure on the base substrate, wherein the signal line transfer structure is configured to connect the signal line lead and the second signal line, wherein the signal line transfer structure and the first signal line are located in the same layer, and the signal line transfer structure is spaced apart from the first signal line; and wherein an orthographic projection of the first electrode of at least one of the sub-pixels on the base substrate at least partially overlaps with an orthographic projection of the first signal line on the base substrate, and the orthographic projection of the first electrode of at least one of the sub-pixels on the base substrate at least partially overlaps with an orthographic projection of the signal line transfer structure on the base substrate. In this way, the plainness of the first electrode may be improved, a tilt of the first electrode may be avoided, and a color shift phenomenon of the display substrate may be improved.

Figure 2:
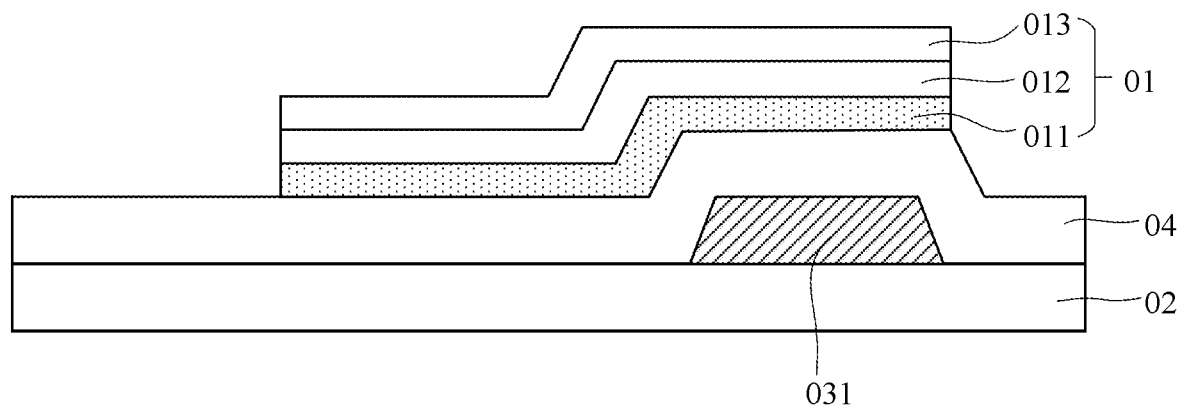
FIG. 2 is a cross-sectional view taken along line AA' in FIG. 1.

FIG. 1 is a partial plan view of an organic light-emission diode (hereinafter referred to as OLED) display substrate in the related art, and FIG. 2 is a cross-sectional view taken along line AA' in FIG. 1. It should be noted that in order to clearly illustrate the relative positional relationship among a signal line, a planarization layer and an anode, some other film layer structures included in the OLED display substrate are omitted in FIGS. 1 and 2.

Referring to FIGS. 1 and 2, the OLED display substrate may include a base substrate 02 and a plurality of sub-pixels arranged on the base substrate 02, for example, SP1, SP2, and SP3 shown in FIG. 1. For example, SP1, SP2, and SP3 in FIG. 1 may represent an area for display in each sub-pixel. For example, a portion corresponding to an opening of a pixel defining layer.

It should be understood that the OLED display substrate may further include: an OLED light-emission device 01 and a pixel driving circuit electrically connected to the OLED light-emission device 01. The pixel driving circuit may be electrically connected to a driving IC located outside the OLED display substrate through a signal line 03. The OLED display substrate may include a planarization layer 04 for covering the pixel driving circuit and the signal line 03. The OLED light-emission device 01 may include an anode 011, an organic light-emission layer 012, and a cathode 013 that are stacked onto each other. The pixel driving circuit may include a plurality of thin film transistors.

For example, the signal line 03 may be located in the same layer as both a source electrode and a drain electrode of a thin film transistor, and may be formed of the same material as the source electrode and the drain electrode.

As shown in FIG. 1 and FIG. 2, in a direction perpendicular to the base substrate 02, at least a portion 031 of the signal line 03 is located below the anode 011. The signal line 03 has a certain thickness that is usually large, for example, usually above 3000 angstroms, and the thickness of the planarization layer 04 covering the signal line 03 and the thickness of the anode 011 are not enough to compensate for a height difference caused by the signal line 03, thus the planarization layer 04 fail to completely planarize the signal line 03. As a result, at a position corresponding to the portion 031 of the signal line 03, the planarization layer 04 may be convex, so that the anode 011 formed on the planarization layer 04 is not sufficiently planar, for example, it may "slope".

Figure 3:
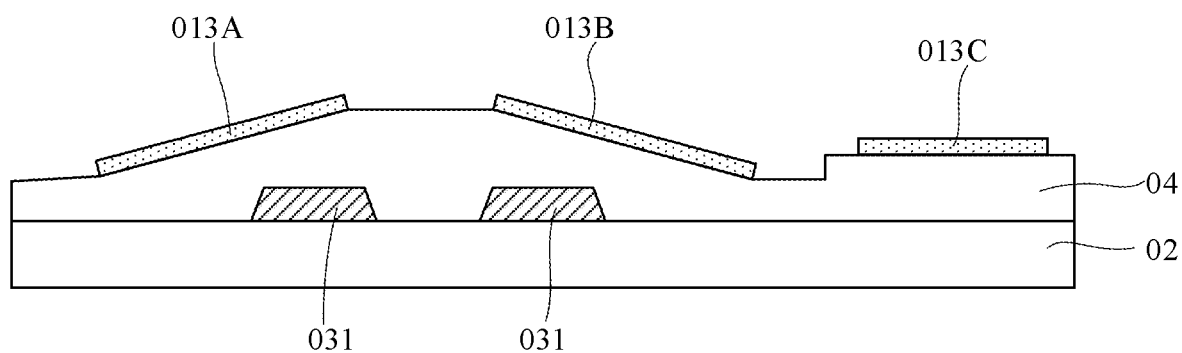
FIG. 3 is a schematic view schematically illustrating plainness of anodes of different sub-pixels of a display substrate in the related art.

FIG. 3 is a schematic view schematically illustrating the plainness of anodes in different sub-pixels of the display substrate in the related art. It should be noted that in order to clearly show unevenness of the anode, FIG. 3 exaggerates a degree of slope. It should be understood that FIG. 3 is not drawn according to actual scale.

Referring to FIG. 3, anodes of three sub-pixels are schematically illustrated. For the convenience of description, the anodes of the three sub-pixels are referred to as 013A, 013B, and 013C, respectively. The anode 013A is located on the leftmost side, under the influence of a signal line 03 below the anode 013A, a right side of the anode 013A is higher than a left side of the anode 013A, so the anode 013A is tilted toward upper-right side as shown in FIG. 3. The anode 013B is located on the middle, under the influence of the signal line 03 below the anode 013B, a left side of the anode 013B is higher than a right side of the anode 013B, so the anode 013B is tilted toward upper-left side as shown in FIG. 3. The anode 013C is located on the rightmost side, there is no signal line 03 below the anode 013C, so the anode 013C does not tilt. Since the anodes of sub-pixels of different colors tilt in different directions and degrees, intensities of light emitted from the three sub-pixels toward left and right sides do not match with each other. In this case, when an image displayed on display substrate is observed at a large viewing angle, color shift may occur. For example, the displayed image may turn red when it is observed from one side, and the displayed image may turn green when it is observed from the other side.

Figure 4:
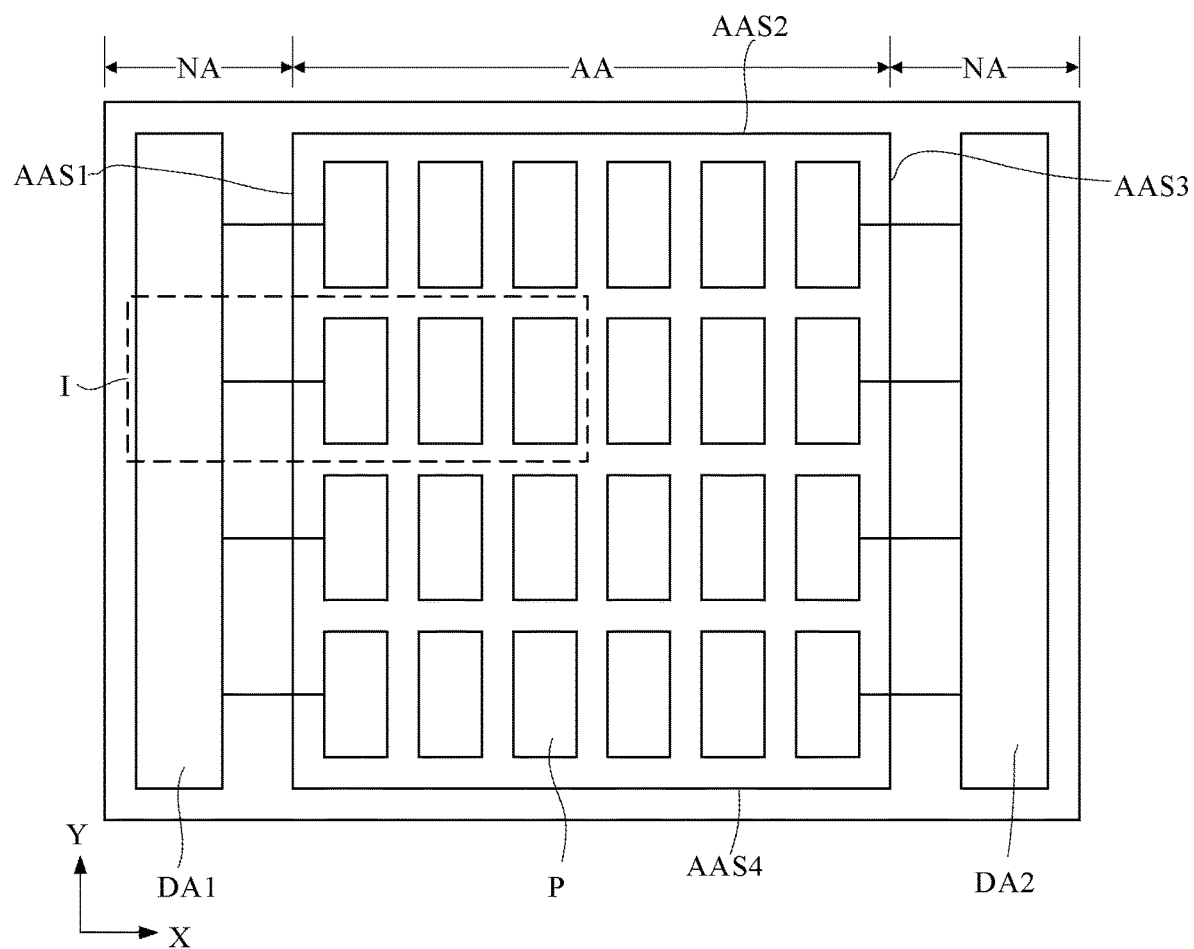
FIG. 4 is a schematic plan view of a display substrate according to some embodiments of the present disclosure.

FIG. 4 is a schematic plan view of a display substrate according to some embodiments of the present disclosure. For example, the display substrate may be an array substrate for an OLED display panel.

Referring to FIG. 4, the display substrate may include a display area AA and a non-display area NA. For example, the display area AA and the non-display area NA may include multiple boundaries, such as AAS1, AAS2, AAS3, and AAS4 as shown in FIG. 4. The display substrate may further include a driving circuit located in the non-display area NA. For example, the driving circuit may be located in at least one side of the display area AA. In the embodiment shown in FIG. 4, the driving circuits are respectively located in left and right sides of the display area AA. It should be noted that the left and right sides may be the left and right sides of the display substrate (screen) viewed by human eyes during display. The driving circuits are configured to drive pixels in the display substrate for display. For example, the driving circuits may include a gate driving circuit and a data driving circuit. The data driving circuit is configured to sequentially latch input data according to a clock signal, then convert the latched data into an analog signal, and input the analog signal to respective data lines of the display substrate. The gate driving circuit is usually implemented by a shift register that converts a clock signal into an on/off voltage and outputs the on/off voltage to respective gate lines of the display substrate.

It should be noted that although FIG. 4 illustrates that the driving circuit is located in the left and right sides of the display area AA, but the embodiment of the present disclosure is not limited to this, and the driving circuit may be located at any suitable position in the non-display area NA.

For example, the driving circuit may adopt GOA technology, that is, Gate Driver on Array. In GOA technology, the gate driving circuit is directly arranged on the array substrate to replace an external driving chip. Each GOA unit acts as a stage of a shift register, and each stage of the shift register is connected to one gate line. The turn-on voltage is output in turn through each stage of the shift register to scan the pixels one-row by one-row. In some embodiments, each stage of the shift register may also be connected to multiple gate lines, thereby adapting to a development trend of high resolution and narrow frame of the display substrate.

Referring to FIG. 4, a left GOA circuit DA1, a plurality of pixels P in the display area AA, and a right GOA circuit DA2 are provided on the display substrate. The left GOA circuit DA1 and the right GOA circuit DA2 are respectively electrically connected to a display IC through signal lines, and the supply of the GOA signal is controlled by the display IC. The display IC is, for example, arranged on the lower side of the display substrate (in the direction observed by human eyes). The left GOA circuit DA1 and the right GOA circuit DA2 are also electrically connected to the pixels through signal lines (for example, gate lines GL) to supply a driving signal to the pixels.

Figure 5:
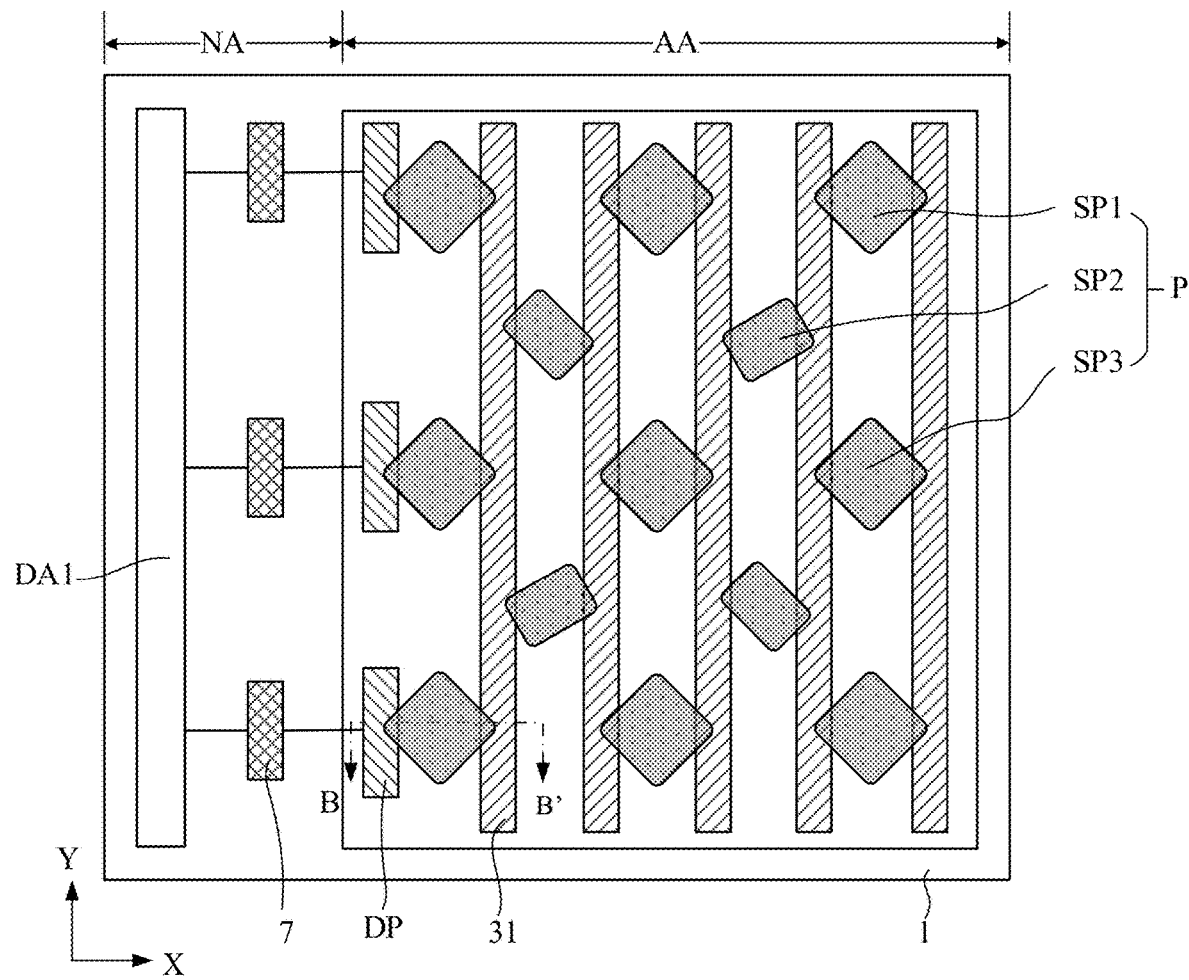
FIG. 5 is a partial enlarged view of the display substrate at part I in FIG. 4 according to some embodiments of the present disclosure.
Figure 6:
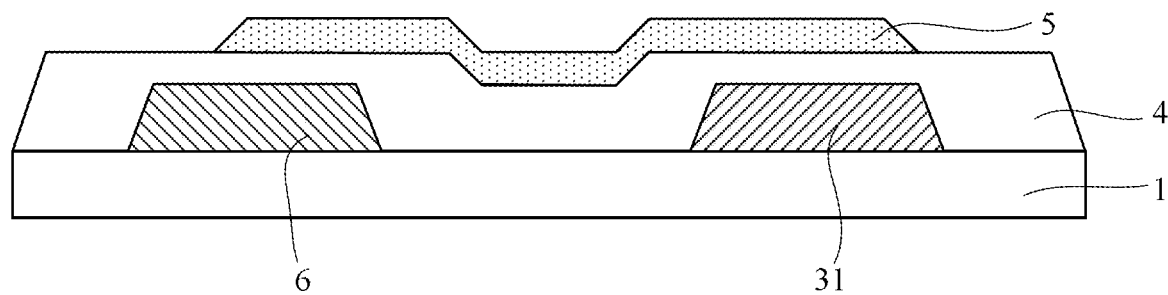
FIG. 6 is a cross-sectional view of the display substrate taken along line BB' in FIG. 5 according to some embodiments of the present disclosure.

FIG. 5 is a partial enlarged view of the display substrate according to some embodiments of the present disclosure at part I in FIG. 4, and FIG. 6 is a cross-section of the display substrate according to some embodiments of the present disclosure taken along line BB' in FIG. 5. It should be noted that in order to clearly illustrate the relative positional relationship between a signal line, a planarization layer and an anode, some other film layer structures included in the display substrate are omitted in FIGS. 5 and 6.

It should also be noted that FIG. 5 exemplarily illustrates that a shape of an orthographic projection of a sub-pixel on a base substrate is a rounded rectangle, but the embodiments of the present disclosure are not limited to this, for example, the shape of the orthographic projection of the sub-pixel on the base substrate may be rectangular, hexagonal, pentagonal, square, circular and other shapes. Moreover, the arrangement of three sub-pixels in one pixel unit is not limited to the form shown in FIG. 5.

Referring to FIGS. 4, 5 and 6 in combination, the display substrate may include a base substrate 1, and a plurality of pixel units P arranged on the base substrate 1 and located in the display area AA. Each pixel unit P may include a plurality of sub-pixels, for example, a first sub-pixel SP1, a second sub-pixel SP2, and a third sub-pixel SP3. For ease of understanding, the first sub-pixel SP1, the second sub-pixel SP2, and the third sub-pixel SP3 may be described as a red sub-pixel, a green sub-pixel, and a blue sub-pixel, respectively, but the embodiments of the present disclosure are not limited thereto.

The plurality of sub-pixels are arranged on the base substrate 1 in an array in a row direction X and in a column direction Y. It should be noted that although in the illustrated embodiments, the row direction X and the column direction Y are perpendicular to each other, the embodiments of the present disclosure are not limited to this.

It should be understood that each sub-pixel includes a pixel driving circuit and a light-emission device. For example, the light-emission device may be an OLED light-emission device, including an anode, an organic light-emission layer, and a cathode that are stacked onto each other. The pixel driving circuit may include a plurality of thin film transistors.

Referring to FIGS. 5 and 6 in combination, the display substrate may include a first signal line 31 on the base substrate 1, a planarization layer 4 disposed on the base substrate 1 and covering the first signal line 31, and an anode 5 on a side of the planarization layer 4 away from the base substrate 1.

The first signal line 31 is configured to supply signals required by sub-pixels located in the display area AA. Hereinafter, the signal line will be described in detail.

Referring to FIG. 5, the display substrate may further include a dummy pixel column and a signal line transfer structure 7, wherein the signal line transfer structure 7 is arranged between the dummy pixel column and the GOA circuit. The dummy pixel column includes a plurality of dummy sub-pixels. The dummy pixel column is located at an edge position of the display area AA close to the GOA circuit. The plurality of dummy sub-pixels are arranged in a column direction Y.

It should be noted that the signal line transfer structure will be described in detail below in conjunction with the drawings.

As shown in FIG. 5, an orthographic projection of the anode 5 on the base substrate 1 at least partially overlaps with an orthographic projection of the first signal line 31 on the base substrate 1, for example, the orthographic projection of the anode 5 on the base substrate 1 covers at least a part of the orthographic projection of the first signal line 31 on the base substrate 1.

For one column of sub-pixels closest to the GOA circuit, for example, the leftmost column of sub-pixels in FIG. 5, an orthographic projection of the anode 5 of each sub-pixel on the base substrate 1 at least partially overlaps with an orthographic projection of a dummy sub-pixel on the base substrate.

Specifically, the dummy sub-pixel includes a cushion structure 6. The cushion structure 6 may be located in the same layer as the first signal line 31, that is, the cushion structure 6 and the first signal line 31 may be made of the same material and formed by the same patterning process. For example, the cushion structure 6 and the first signal line 31 may be located in the same layer as the source/drain electrodes of the thin film transistor. In this way, a thickness of the cushion structure 6 is approximately equal to a thickness of the first signal line 31.

For the leftmost column of sub-pixels in FIG. 5, the orthographic projection of the anode 5 of each sub-pixel on the base substrate 1 at least partially overlaps with an orthographic projection of the cushion structure 6 of the dummy sub-pixel on the base substrate 1.

Herein, for the convenience of description, a sub-pixel located at the edge of the display area close to the non-display area may be called an edge sub-pixel. For example, the leftmost column of sub-pixels in FIG. 5 includes a plurality of edge sub-pixels. In some embodiments, a boundary between the display area and the non-display area may be determined according to the column of sub-pixels for display when the display substrate emits light. For example, a left boundary between the display area and the non-display area may be located on the left side of the leftmost column of edge sub-pixels close to the non-display area, and the leftmost column of edge sub-pixels close to the non-display area may be located in the display area. For example, the plurality of sub-pixels include at least one array of edge sub-pixels located at an edge position of the display area close to the non-display area. For example, the at least one array of edge sub-pixels may include one column of edge sub-pixels, and/or may include one row of edge sub-pixels. And for example, the at least one array of edge sub-pixels may include two columns of edge sub-pixels on opposite sides, and/or two rows of edge sub-pixels on opposite sides. For example, in some embodiments, the display area may be approximately rectangular. In this case, the at least one array of edge sub-pixels may include two columns of sub-pixels, wherein the two columns of sub-pixels are located in two opposite sides of the rectangle and close to the non-display area. With reference to FIGS. 4 and 5 in combination, the at least one array of edge sub-pixels may include some edge sub-pixels disposed close to the boundaries AAS1 and AAS3, or in other words, the at least one array of edge sub-pixels is located on a side where the GOA circuit is located. In the examples of FIGS. 4 and 5, the GOA circuits are located on the left and right sides. Accordingly, the at least one array of edge sub-pixels includes edge sub-pixels located at the left and right edges of the display area AA, that is, the at least one array of edge sub-pixels may include the leftmost column of sub-pixels and the rightmost column of sub-pixels.

That is, the first signal line 31 is provided below one side of the anode 5 of each edge sub-pixel, the cushion structure 6 is provided below the other side of the anode 5 of each edge sub-pixel, and the thickness of the first signal line 31 is equal to the thickness of cushion structure 6. In this way, the plainness of the anode 5 may be improved, and the slope of the anode 5 may be avoided, so that a color shift phenomenon of the display substrate may be improved.

The inventor discovered that since the signal lines are relatively concentrated at the edge of the display area, the tilt phenomenon of anodes of sub-pixels located at the edge of the display area is more obvious. In the embodiments of the present disclosure, the anodes of the sub-pixels located at the edge of the display area is padded by the structure in the dummy sub-pixels located at the edge of the display area, so that the anode tilt phenomenon at the edge may be improved, and the color shift phenomenon of the display substrate may be improved effectively.

Hereinafter, a signal line transfer structure included in a display substrate according to some embodiments of the present disclosure will be described in detail with reference to the drawings.

Figure 7A:
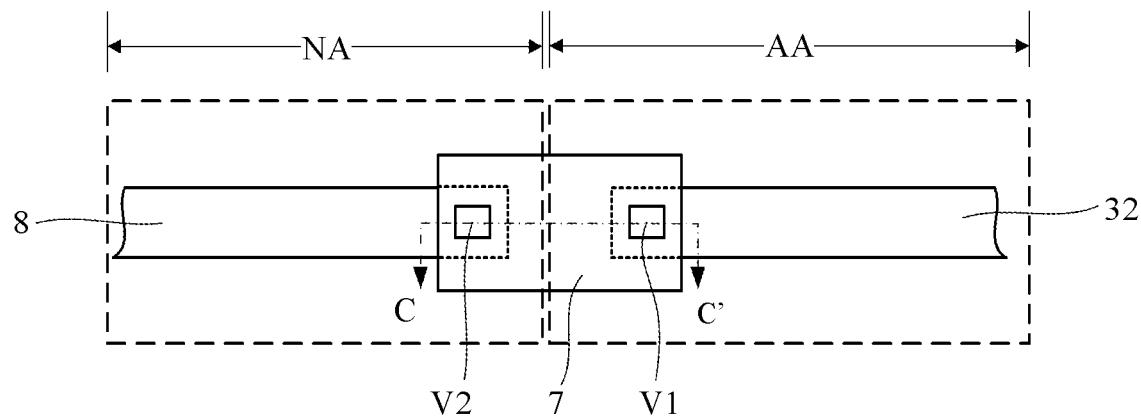
FIG. 7A is a schematic view of a signal line transfer structure of a display substrate according to some embodiments of the present disclosure.
Figure 8A:
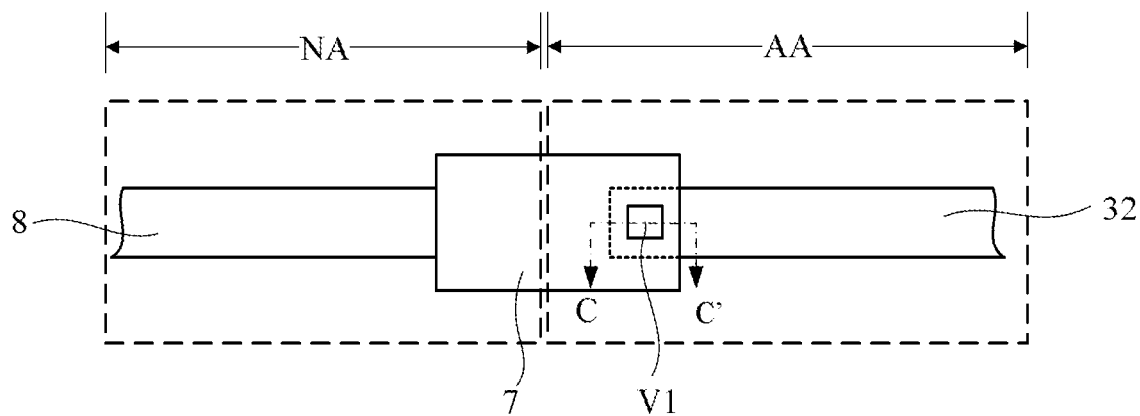
FIG. 8A is a schematic view of a signal line transfer structure of a display substrate according to some embodiments of the present disclosure.
Figure 9A:
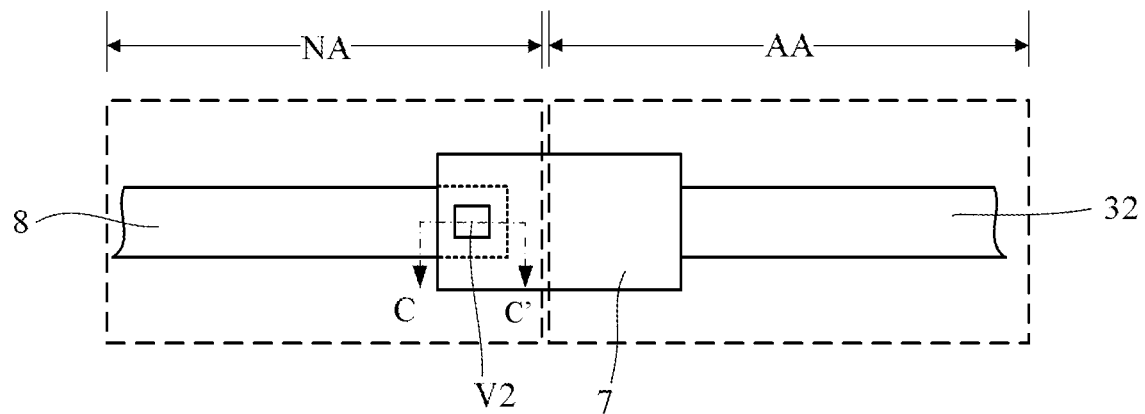
FIG. 9A is a schematic view of a signal line transfer structure of a display substrate according to some embodiments of the present disclosure.

FIG. 7A, FIG. 8A and FIG. 9A are respectively schematic views of a signal line transfer structure of the display substrate according to some embodiments of the present disclosure. Referring to FIG. 7A, FIG. 8A and FIG. 9A, the display substrate may include: a second signal line 32 at least in the display area AA, a signal line lead 8 in the non-display area NA, and a signal line transfer structure 7 at least in the non-display area NA. One end of the second signal line 32 (for example, an end away from the signal line lead) is connected to a pixel driving circuit of a sub-pixel. One end of the signal line lead 8 (for example, an end away from the second signal line 32) is connected to a GOA circuit. One end of the signal line transfer structure 7 is connected to the other end of the second signal line 32, and the other end of the signal line transfer structure 7 is connected to the other end of the signal line lead 8.

In the embodiments of the present disclosure, the second signal line 32 and the signal line lead 8 are two independent portions, wherein the two independent portions means that the second signal line 32 and the signal line lead 8 are spaced apart from each other, that is, orthographic projections of the second signal line 32 and the signal line lead 8 on the base substrate 1 are not in contact with each other.

In this way, even if a large amount of static charge is accumulated on the signal line lead 8 in the non-display area NA, the second signal line 32 and the signal line lead 8 are two independent portions in the embodiments of the present disclosure, before the signal line 32 and the signal line lead 8 are connected by the signal line transfer structure 7, a large amount of static charge accumulated on the signal line lead 8 in the non-display area NA may not be transferred to the second signal line 32 in the display area AA, thereby reducing the probability of damage to electronic devices in the display area AA that are electrically connected to the second signal line 32 (for example, transistors T2 and T3 in a pixel driving circuit mentioned hereinafter) due to electrostatic impact, thus the product yield may be improved.

In some exemplary embodiments, at least one of the second signal line 32 and the signal line lead 8 is located in a different layer from the signal line transfer structure 7.

For example, the second signal line 32 and the signal line lead 8 may be located in the same layer, that is, the second signal line 32 and the signal line lead 8 are made of the same material and formed by one patterning process. Optionally, the second signal line 32 and the signal line lead 8 may be located in different layers, that is, the second signal line 32 and the signal line lead 8 need to be formed by two patterning processes, which are not limited in the embodiment of the present disclosure. The setting method may be selected according to the type of the display substrate and the type of the signal line, as long as the signal line transfer structure 7, the second signal line 32 and the signal line lead 8 are not located in the same layer and are not directly connected, that is, the signal line transfer structure 7, the second signal line 32, and the signal line lead 8 are arranged in at least two layers.

Figure 7B:
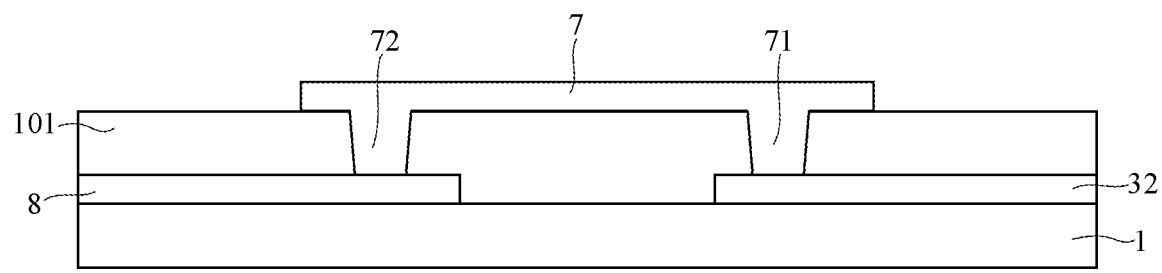
FIG. 7B is a cross-sectional view taken along line CC' in FIG. 7A.

FIG. 7B is a cross-sectional view taken along line CC' in FIG. 7A. Referring to FIGS. 7A and 7B in combination, the second signal line 32 and the signal line lead 8 are located in the same layer, and they are located in a different layer from the signal line transfer structure 7. An insulating layer 101 is provided between the layer where the second signal line 32 and the signal line lead 8 are located and the layer where the signal line transfer structure 7 is located. A first via hole V1 and a second via hole V2 are formed in the insulating layer 101.

For example, the second signal line 32 and the signal line lead 8 may be located in the same layer as source/drain electrodes of a thin film transistor, that is, the second signal line 32 and the signal line lead 8 may be made of material forming the source/drain electrodes. The signal line transfer structure 7 may be located in a side of the layer where the second signal line 32 and the signal line lead 8 are located away from the base substrate 1. The signal line transfer structure 7 may also be made of, for example, material forming the source/drain electrodes. Of course, the embodiments of the present disclosure are not limited to this, and the second signal line 32, the signal line lead 8 and the signal line transfer structure 7 may also be made of other conductive materials. The insulating layer 101 may be made of an insulating material such as silicon nitride, silicon oxide, or silicon oxynitride. The insulating layer 101 may have a single film layer structure or a stacked structure composed of a plurality of film layers.

The first via hole V1 passes through the insulating layer 101 to expose a part of the second signal line 32. The second via hole V2 passes through the insulating layer 101 to expose a par of the signal line lead 8. A part of the signal line transfer structure 7 is formed in the first via hole V1 to form a first conductive plug 71, and the signal line transfer structure 7 is in contact with the second signal line 32 through the first conductive plug 71. Another part of the signal line transfer structure 7 is formed in the second via hole V2 to form a second conductive plug 72, and the signal line transfer structure 7 is in contact with the signal line lead 8 through the second conductive plug 72.

Figure 8B:
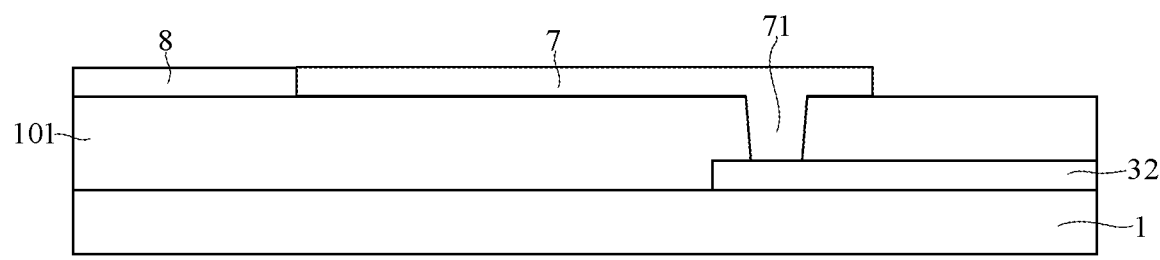
FIG. 8B is a cross-sectional view taken along line CC' in FIG. 8A.

FIG. 8B is a cross-sectional view taken along line CC' in FIG. 8A. Referring to FIGS. 8A and 8B in combination, the second signal line 32 and the signal line lead 8 are located in different layers, and the signal line transfer structure 7 and the signal line lead 8 may be located in the same layer.

One end of the signal line transfer structure 7 is directly connected to the signal line lead 8. Optionally, the signal line transfer structure 7 and the signal line lead 8 may be continuously extended, that is, the signal line transfer structure 7 and the signal line lead 8 are formed in an integral structure.

An insulating layer 101 is provided between the second signal line 32 and the layer where the signal line transfer structure 7 and the signal line lead 8 are located. A first via hole V1 is provided in the insulating layer 101.

The first via hole V1 passes through the insulating layer 101 to expose a part of the second signal line 32. A part of the signal line transfer structure 7 is formed in the first via hole V1 to form a first conductive plug 71, and the signal line transfer structure 7 is in contact with the second signal line 32 through the first conductive plug 71.

Figure 9B:
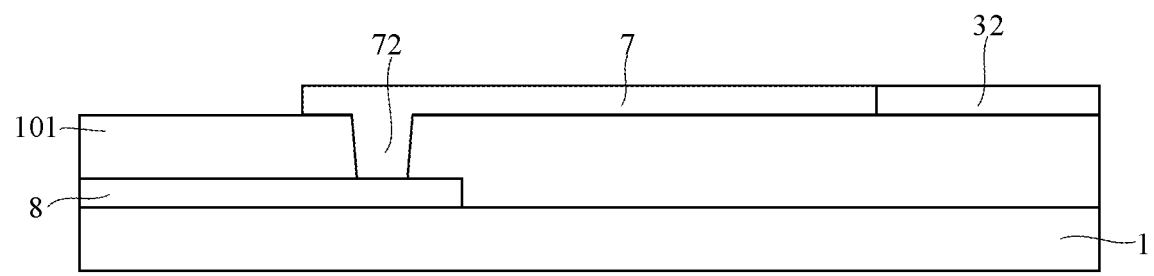
FIG. 9B is a cross-sectional view taken along line CC' in FIG. 9A.

FIG. 9B is a cross-sectional view taken along line CC' in FIG. 9A. Referring to FIGS. 9A and 9B in combination, the second signal line 32 and the signal line lead 8 are located in different layers, and the signal line transfer structure 7 and the second signal line 32 may be located in the same layer.

One end of the signal line transfer structure 7 is directly connected to the second signal line 32. Optionally, the signal line transfer structure 7 and the second signal line 32 may extend continuously, that is, the signal line transfer structure 7 and the second signal line 32 are formed in an integral structure.

An insulating layer 101 is provided between the signal line lead 8 and the layer where the signal line transfer structure 7 and the second signal line 32 are located. A second via hole V2 is provided in the insulating layer 101.

The second via hole V2 passes through the insulating layer 101 to expose a part of the signal line lead 8. A part of the signal line transfer structure 7 is formed in the second via hole V2 to form a second conductive plug 72, and the signal line transfer structure 7 is in contact with the signal line lead 8 through the second conductive plug 72.

Figure 10:
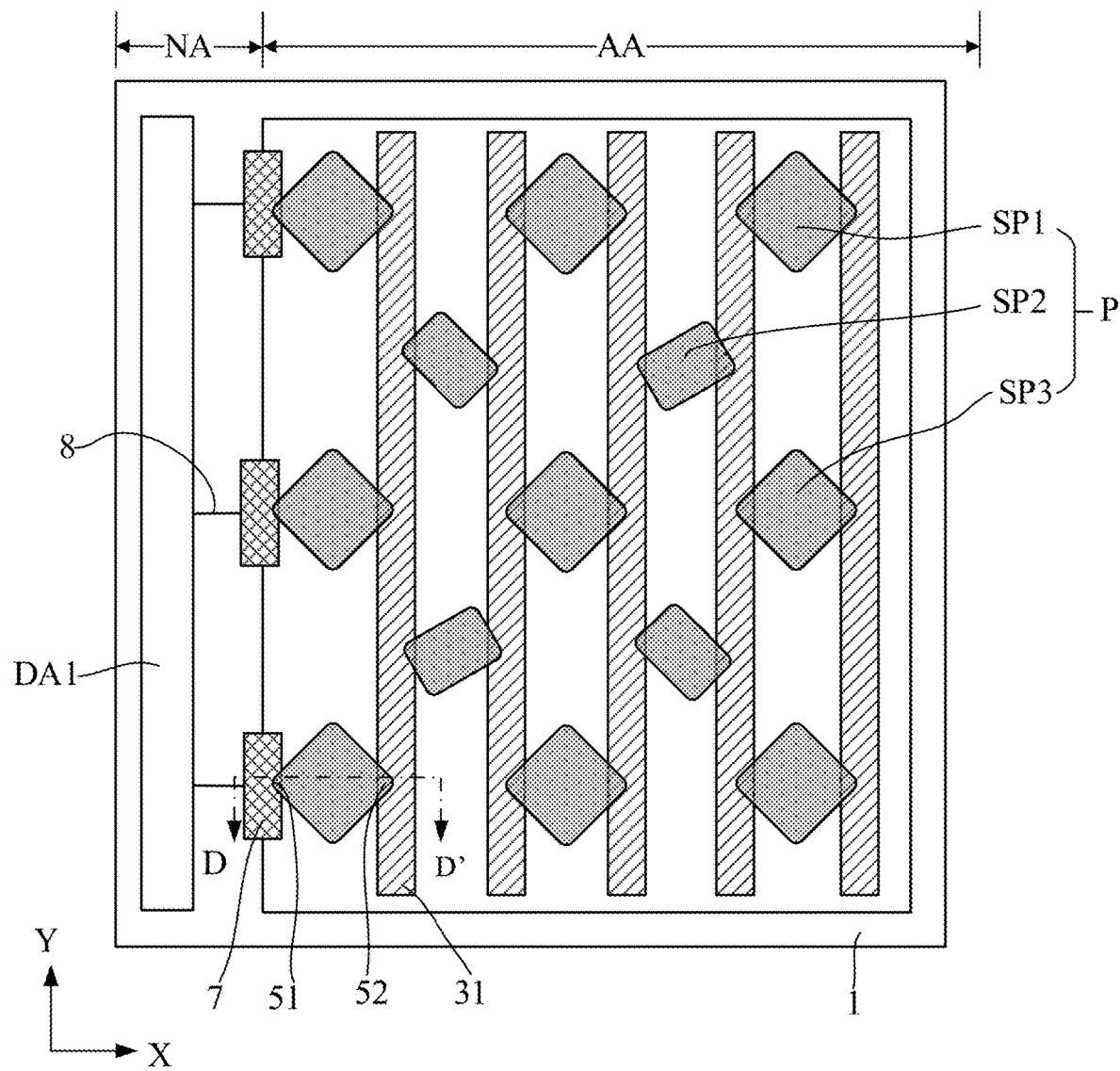
FIG. 10 is a partial enlarged view of the display substrate at part I in FIG. 4 according to some embodiments of the present disclosure.
Figure 11:
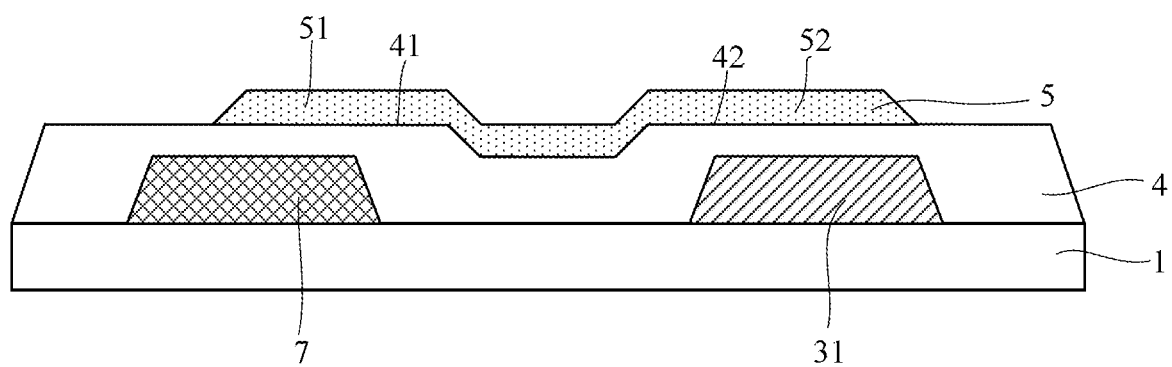
FIG. 11 is a cross-sectional view of the display substrate taken along line DD' in FIG. 10 according to some embodiments of the present disclosure.

FIG. 10 is a partial enlarged view of the display substrate according to some embodiments of the present disclosure at part I in FIG. 4, and FIG. 11 is a cross-section of the display substrate according to some embodiments of the present disclosure taken along line DD' in FIG. 10. It should be noted that, in order to clearly illustrate the relative positional relationship between a signal line, a planarization layer and an anode, some other film layer structures included in the display substrate are omitted in FIGS. 10 and 11.

In the following, the differences between the embodiments and the above-mentioned embodiments with reference to FIG. 4 and FIG. 5 will be mainly described. For similarities between the embodiments, which may be refer the above description and will not be repeated here.

Referring to FIGS. 4, 10, and 11, in some embodiments of the present disclosure, the dummy pixel column is omitted. In other words, there is no dummy pixel column between the pixel unit P located in the display area AA and the GOA circuit. In this way, the width of the non-display area NA may be further reduced, thereby realizing a display panel and a display device with a narrow frame.

Referring to FIGS. 10 and 11 in combination, the display substrate may include the first signal line 31 on the base substrate 1, the planarization layer 4 on the base substrate 1 and covering the first signal line 31, and the anode 5 on a side of the planarization layer 4 away from the base substrate 1.

The display substrate may further include the signal line transfer structure 7 at a position of the display area AA close to the edge of the GOA circuit. As shown in FIG. 10, the plurality of signal line transfer structures 7 may be arranged in the column direction Y.

As shown in FIG. 10, the edge sub-pixels include at least one column of edge sub-pixels, and the at least one column of edge sub-pixels are arranged in a direction that is substantially the same as an extending direction of the first signal line 31, and the plurality of signal line transfer structures 7 are arranged in the direction that is substantially the same as the extending direction of the first signal line 31.

As shown in FIG. 10, an orthographic projection of the anode 5 on the base substrate 1 at least partially overlaps with an orthographic projection of the first signal line 31 on the base substrate 1, for example, the orthographic projection of the anode 5 on the base substrate 1 covers the orthographic projection of the first signal line 31 on the base substrate 1.

For one column of sub-pixels closest to the GOA circuit, for example, the leftmost column of sub-pixels in FIG. 10, that is, for a plurality of edge sub-pixels, orthographic projections of the anodes 5 of the edge sub-pixels on the base substrate 1 at least partially overlap with orthographic projections of respective signal line transfer structures 7 on the base substrate 1.

It should be noted that, for other sub-pixels except the plurality of edge sub-pixels, for example, a plurality of sub-pixels located inside the display area, the plurality of sub-pixels are all located between two adjacent first signal lines 31. That is, an orthographic projection of a side of the anode 5 of one sub-pixel on the base substrate 1 at least partially overlaps with an orthographic projection of one first signal line 31 on the base substrate 1, an orthographic projection of an opposite side of the anode 5 of the sub-pixel on the base substrate 1 at least partially overlaps with an orthographic projection of another adjacent first signal line 31 on the base substrate 1.

For example, the at least one array of edge sub-pixels may include a plurality of red sub-pixels and a plurality of blue sub-pixels alternately arranged in the column direction. An orthographic projection of the anode 5 of each green sub-pixel on the base substrate 1 does not overlap with an orthographic projection of the signal line transfer structure 7 on the base substrate 1. For example, as described above, the orthographic projection of the anode 5 of each green sub-pixel on the base substrate 1 may at least partially overlaps with the orthographic projection of each of two adjacent first signal lines 31 on the base substrate 1.

Specifically, referring to FIG. 11, the first signal line 31 is provided below one side of the anode 5 of each edge sub-pixel, and the signal line transfer structure 7 is provided below the other side of the anode 5 of each edge sub-pixel. More specifically, the anode 5 of each edge sub-pixel includes a first edge portion 51 close to the non-display area NA and a second edge portion 52 away from the non-display area NA (the first edge portion 51 and the second edge portion 52 will be described in detail below). An orthographic projection of the first edge portion 51 on the base substrate 1 at least partially overlaps with the orthographic projection of the signal line transfer structure 7 on the base substrate 1, and an orthographic projection of the second edge portion 52 on the base substrate 1 at least partially overlaps with the orthographic projection of the first signal line 31 on the base substrate 1.

For example, the first signal line 31 and the signal line transfer structure 7 are located in the same layer, and the first signal line 31 and the signal line transfer structure 7 may be located in the same layer as source/drain electrodes of a thin film transistor, that is, the first signal line 31 and the signal line transfer structure 7 may be made of materials forming the source/drain electrodes and formed by the same patterning process. In this way, the thickness of the first signal line 31 may be equal to the thickness of the signal line transfer structure 7, that is, the thickness of the signal line transfer structure 7 in the direction perpendicular to the base substrate 1 is equal to the thickness of the first signal line 31 in the direction perpendicular to the base substrate 1.

With continued reference to FIG. 11, the planarization layer 4 includes a first surface portion 41 and a second surface portion 42. An orthographic projection of the first surface portion 41 on the base substrate 1 at least partially overlaps with the orthographic projection of the signal line transfer structure 7 on the base substrate 1, and an orthographic projection of the second surface portion 42 on the base substrate 1 at least partially overlaps with the orthographic projection of the first signal line 31 on the base substrate 1. A distance between the first surface portion 41 and the base substrate 1 in the direction perpendicular to the base substrate 1 is approximately equal to a distance between the second surface portion 42 and the base substrate 1 in the direction perpendicular to the base substrate 1, or the ratio of the distances is approximately 0.8 to 1.2.

It should be noted that, in FIG. 11, the relative positional relationship of the signal line transfer structure, the signal line, the planarization layer, and the anode is schematically illustrated. Limited by the actual processing technology, the first surface portion 41 and the second surface portion 42 of the planarization layer 4 may have a height error. In such a case, the distance between the first surface portion 41 and the base substrate 1 in the direction perpendicular to the base substrate 1 may be understood as the maximum distance between the first surface portion 41 and the base substrate 1 in the direction perpendicular to the base substrate 1, and the distance between the second surface portion 42 and the base substrate 1 in the direction perpendicular to the base substrate 1 may be understood as the maximum distance between the second surface portion 42 and the base substrate 1 in the direction perpendicular to the base substrate 1; or, the distance between the first surface portion 41 and the base substrate 1 in the direction perpendicular to the base substrate 1 may be understood as an average distance between the first surface portion 41 and the base substrate 1 in the direction perpendicular to the base substrate 1, and the distance between the second surface portion 42 and the base substrate 1 in the direction perpendicular to the base substrate 1 may be understood as an average distance between the second surface portion 42 and the base substrate 1 in the direction perpendicular to the base substrate 1.

In this way, the plainness of the anode 5 may be improved, so that a distance between the first edge portion 51 of the anode 5 and the base substrate 1 in the direction perpendicular to the base substrate 1 is substantially equal to a distance between the second edge portion 52 and the base substrate 1 in the direction perpendicular to the base substrate 1. Therefore, the anode 5 may not tilt, so that color shift of the display substrate may be improved.

Based on the above description, the distance between the first edge 51 of the anode 5 and the base substrate 1 in the direction perpendicular to the base substrate 1 may be understood as the maximum distance between the first edge 51 of the anode 5 and the base substrate 1 in the direction perpendicular to the base substrate 1, and the distance between the second edge portion 52 and the base substrate 1 in the direction perpendicular to the base substrate 1 may be understood as the maximum distance between the second edge portion 52 and the base substrate 1 in the direction perpendicular to the base substrate 1. Alternatively, the distance between the first edge 51 of the anode 5 and the base substrate 1 in the direction perpendicular to the base substrate 1 may be understood as an average distance between the first edge 51 of the anode 5 and the base substrate 1 in the direction perpendicular to the base substrate 1, and the distance between the second edge portion 52 and the base substrate 1 in the direction perpendicular to the base substrate 1 may be understood as an average distance between the second edge portion 52 and the base substrate 1 in the direction perpendicular to the base substrate 1.

In addition, in the embodiments of the present disclosure, the signal line transfer structure is used to cushion the anode, and the dummy pixel column is omitted. While improving the plainness of anode, the width of the non-display area may be reduced, which is beneficial to realize a display device with a narrow frame.

Hereinafter, by taking 7T1C pixel driving circuit as an example, the structure of the pixel driving circuit will be described in detail. However, the embodiments of the present disclosure are not limited to the 7T1C pixel driving circuit, and other known pixel driving circuit structures may be applied to the embodiments of the present disclosure under the condition of no conflict.

Figure 12:
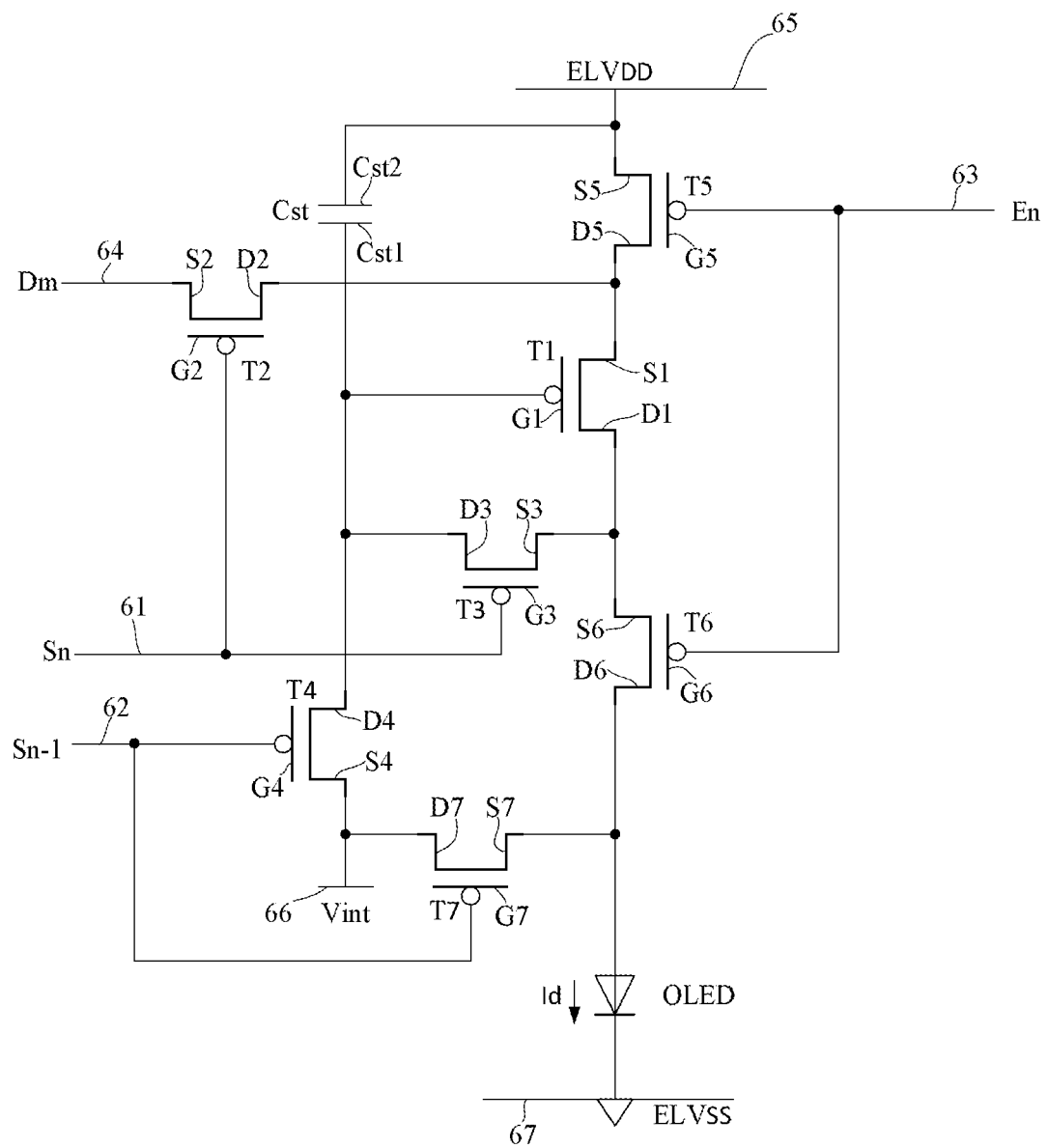
FIG. 12 is an equivalent circuit diagram of a pixel driving circuit of a display substrate according to some embodiments of the present disclosure.

FIG. 12 is an equivalent circuit diagram of one pixel driving circuit of a display substrate according to some embodiments of the present disclosure. As shown in FIG. 12, the pixel driving circuit may include a plurality of signal lines 61, 62, 63, 64, 65, 66 and 67, a plurality of thin film transistors T1, T2, T3, T4, T5, T6, and T7, and a storage capacitor Cst. The pixel driving circuit is configured to drive an organic light-emission diode (i.e., OLED).

The plurality of thin film transistors include a driving thin film transistor T1, a switching thin film transistor T2, a compensation thin film transistor T3, an initialization thin film transistor T4, a first light-emission control thin film transistor T5, a second light-emission control thin film transistor T6, and a bypass thin film transistor T7.

The plurality of signal lines include: a scan signal lines 61 for transmitting scan signals Sn, a reset control signal line 62 for transmitting reset control signal Sn−1 to the initialization thin film transistor T4, a light-emission control line 63 for transmitting light-emission control signal En to the first light-emission control thin film transistor T5 and the second light-emission control thin film transistor T6, a data line 64 for transmitting data signals Dm, a driving voltage line 65 for transmitting driving voltage ELVDD, an initializing voltage line 66 for transmitting initialization voltage Vint for initializing the driving thin film transistor T1, and a power supply line 67 for transmitting ELVSS voltage.

A gate electrode G1 of the driving thin film transistor T1 is electrically connected to an end Cst1 (hereinafter referred to as a first capacitor electrode) of the storage capacitor Cst, a source electrode S1 of the driving thin film transistor T1 is electrically connected to the driving voltage line 65 through the first light-emission control thin film transistor T5, and a drain electrode D1 of the driving thin film transistor T1 is electrically connected to an anode of the OLED through the second light-emission control thin film transistor T6. The driving thin film transistor T1 receives a data signal Dm according to a switching operation of the switching thin film transistor T2, so as to supply a driving current Id to the OLED.

A gate electrode G2 of the switching thin film transistor T2 is electrically connected to the scan signal line 61, a source electrode S2 of the switching thin film transistor T2 is electrically connected to the data line 64. A drain electrode D2 of the switching thin film transistor T2 is electrically connected to the driving voltage line 65 through the first light-emission control thin film transistor T5 and is also electrically connected to the source electrode S1 of the driving thin film transistor T1. The switching thin film transistor T2 is turned on according to the scan signal Sn transmitted through the scan signal line 61, then performs a switching operation to transmit the data signal Dm transmitted to the data line 64 to the source electrode S1 of the driving thin film transistor T1.

A gate electrode G3 of the compensation thin film transistor T3 is electrically connected to the scan signal line 61, a source electrode S3 of the compensation thin film transistor T3 is electrically connected to the anode of the OLED via the second light-emission control thin film transistor T6 and is electrically connected to the drain electrode D1 of the driving thin film transistor T1. A drain electrode D3 of the compensation thin film transistor T3 is electrically connected to one end Cst1 (i.e., the first capacitor electrode) of the storage capacitor Cst, a drain electrode D4 of the initialization thin film transistor T4, and the gate electrode G1 of the driving thin film transistor T1. The compensation thin film transistor T3 is turned on according to the scan signal Sn transmitted through the scan signal line 61, so that the gate electrode G1 of the driving thin film transistor T1 is connected to the drain electrode D1 of the driving thin film transistor T1, thereby performing diode connection for the driving thin film transistor T1.

A gate electrode G4 of the initialization thin film transistor T4 is electrically connected to the reset control signal line 62, and a source electrode S4 of the initialization thin film transistor T4 is electrically connected to the initializing voltage line 66. In addition, the drain electrode D4 of the initializing thin film transistor T4 is electrically connected to one end Cst1 of the storage capacitor Cst, the drain electrode D3 of the compensation thin film transistor T3, and the gate electrode G1 of the driving thin film transistor T1. The initialization thin film transistor T4 is turned on according to the reset control signal Sn−1 transmitted through the reset control signal line 62, thereby, an initialization operation is performed to initialize a voltage of the gate electrode G1 of the driving thin film transistor T1.

A gate electrode G5 of the first light-emission control thin film transistor T5 is electrically connected to the light-emission control line 63, and a source electrode S5 of the first light-emission control thin film transistor T5 is electrically connected to the driving voltage line 65. A drain electrode D5 of the first light-emission control thin film transistor T5 is electrically connected to the source electrode S1 of the driving thin film transistor T1 and is electrically connected to the drain electrode D2 of the switching thin film transistor T2.

A gate electrode G6 of the second light-emission control thin film transistor T6 is electrically connected to the light-emission control line 63, a source electrode S6 of the second light-emission control thin film transistor T6 is electrically connected to the drain electrode D1 of the driving thin film transistor T1 and is electrically connected to the source electrode S3 of the compensation thin film transistor T3. A drain electrode D6 of the second light-emission control thin film transistor T6 is electrically connected to the anode of the OLED. The first light-emission control thin film transistor T5 and the second light-emission control thin film transistor T6 are turned on simultaneously according to the light-emission control signal En transmitted through the light-emission control line 63, to transmit the driving voltage ELVDD to the OLED, thereby allowing the driving current Id to flow into the OLED.

The bypass thin film transistor T7 includes a gate electrode G7, a source electrode S7 and a drain electrode D7. The gate electrode G7 is connected to the reset control signal line 62, the source electrode S7 is connected to the drain electrode D6 of the second light-emission control thin film transistor T6 and the anode electrode of the OLED, and the drain electrode D7 is connected to the initializing voltage line 66. The bypass thin film transistor T7 transmits the reset control signal Sn−1 from the reset control signal line 62 to the gate electrode G7.

The other end Cst2 (hereinafter referred to as a second capacitance electrode) of the storage capacitor Cst is electrically connected to the driving voltage line 65, and a cathode of the OLED is electrically connected to the power supply line 67 to receive a common voltage ELVSS. Accordingly, the OLED receives the driving current Id from the driving thin film transistor T1 to emit light, thereby displaying an image.

It should be noted that, in FIG. 12, the thin film transistors T1, T2, T3, T4, T5, T6, and T7 each have a single gate structure, but the embodiments of the present disclosure are not limited thereto, at least some of the thin film transistors T1, T2, T3, T4, T5, T6, and T7 may have a dual gate structure. In FIG. 12, the thin film transistor T1, T2, T3, T4, T5, T6, and T7 each are p-channel field effect transistor, but the embodiments of the present disclosure are not limited thereto, and at least some of the thin film transistors T1, T2, T3, T4, T5, T6, and T7 may be n-channel field effect transistors.

In operation, during initialization phase, the reset control signal Sn−1 with a low level is supplied through the reset control signal line 62. Next, the initialization thin film transistor T4 is turned on based on the low level of the reset control signal Sn−1, and the initialization voltage Vint from the initializing voltage line 66 is transmitted to the gate electrode G1 of the driving thin film transistor T1 through the initialization thin film transistor T4. Therefore, the driving thin film transistor T1 is initialized due to the initialization voltage Vint.

During data programming phase, the scan signal Sn with a low level is supplied through the scan signal line 61. Next, the switching thin film transistor T2 and the compensation thin film transistor T3 are turned on based on the low level of the scan signal Sn. Therefore, the driving thin film transistor T1 is placed in a diode connection state due to the turned-on compensation thin film transistor T3, and the driving thin film transistor T1 is biased in a forward direction.

Next, a compensation voltage Dm+Vth (for example, Vth is a negative value) is obtained by subtracting a threshold voltage Vth of the driving thin film transistor T1 from the data signal Dm supplied via the data line 64, and the compensation voltage Dm+Vth is applied to the gate electrode G1 of the driving thin film transistor T1. Next, the driving voltage ELVDD and the compensation voltage Dm+Vth are applied to two ends of the storage capacitor Cst, so that the electric charge corresponding to a voltage difference between the two ends is stored in the storage capacitor Cst.

During the light-emission phase, the light-emission control signal En from the light-emission control line 63 changes from a high level to a low level. Next, during the light emission phase, the first light-emission control thin film transistor T5 and the second light-emission control thin film transistor T6 are turned on based on a low level of the light-emission control signal En.

Next, a driving current is generated based on a difference between the voltage of the gate electrode G1 of the driving thin film transistor T1 and the driving voltage ELVDD. The driving current Id corresponding to a difference between the driving current and the bypass current is supplied to the OLED through the second light-emission control thin film transistor T6.

During the light-emission phase, based on the current-voltage relationship of the driving thin film transistor T1, a gate-source voltage of the driving thin film transistor T1 is maintained at (Dm+Vth)-ELVDD due to the storage capacitor Cst. The driving current Id is proportional to $(Dm-ELVDD)^2$. Therefore, the driving current Id may not be affected by a variation of the threshold voltage Vth of the driving thin film transistor T1.

Figure 13:
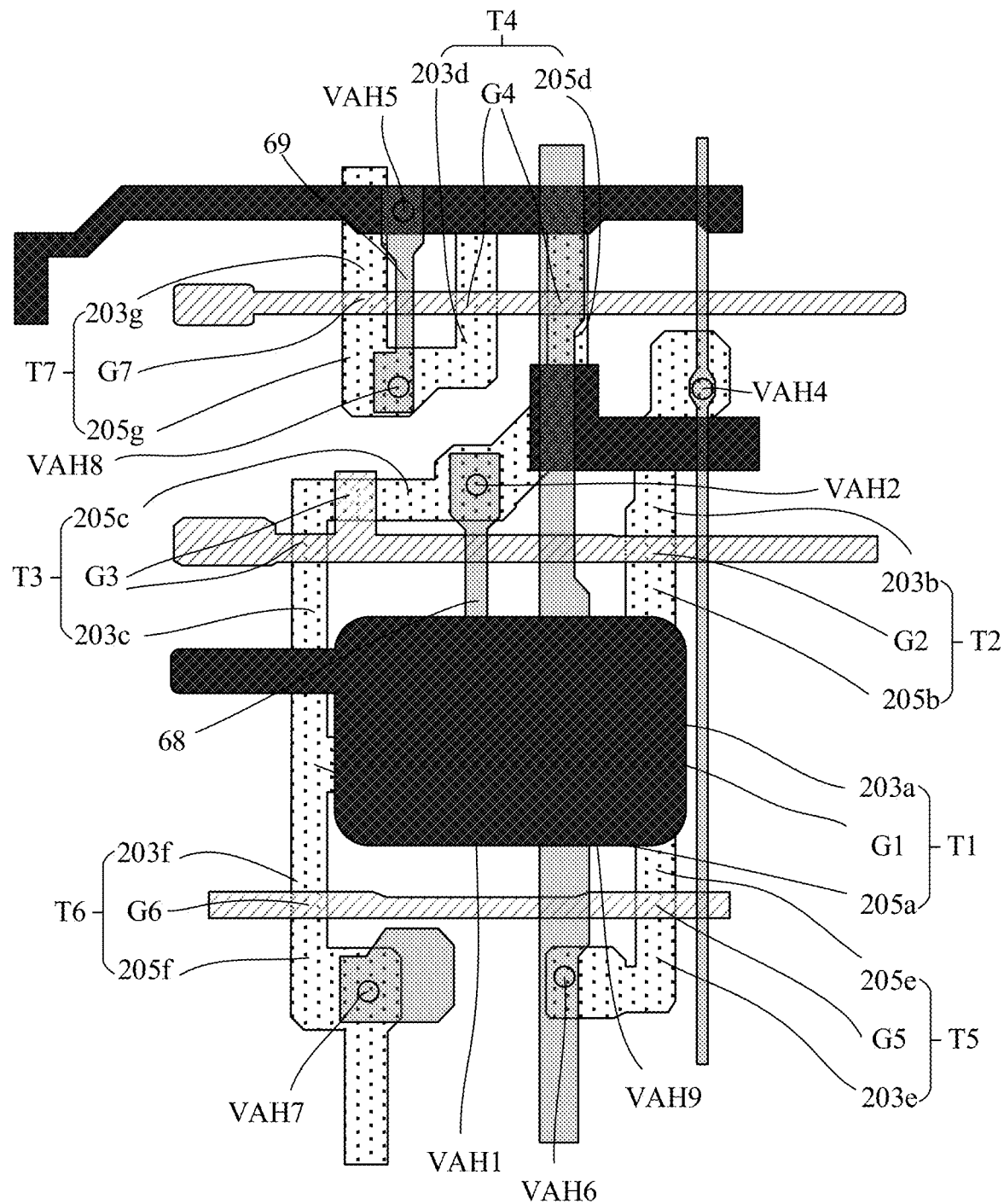
FIG. 13 is a plan view illustrating an exemplary embodiment of sub-pixels in a display area AA of a display substrate according to some embodiments of the present disclosure.
Figure 14:
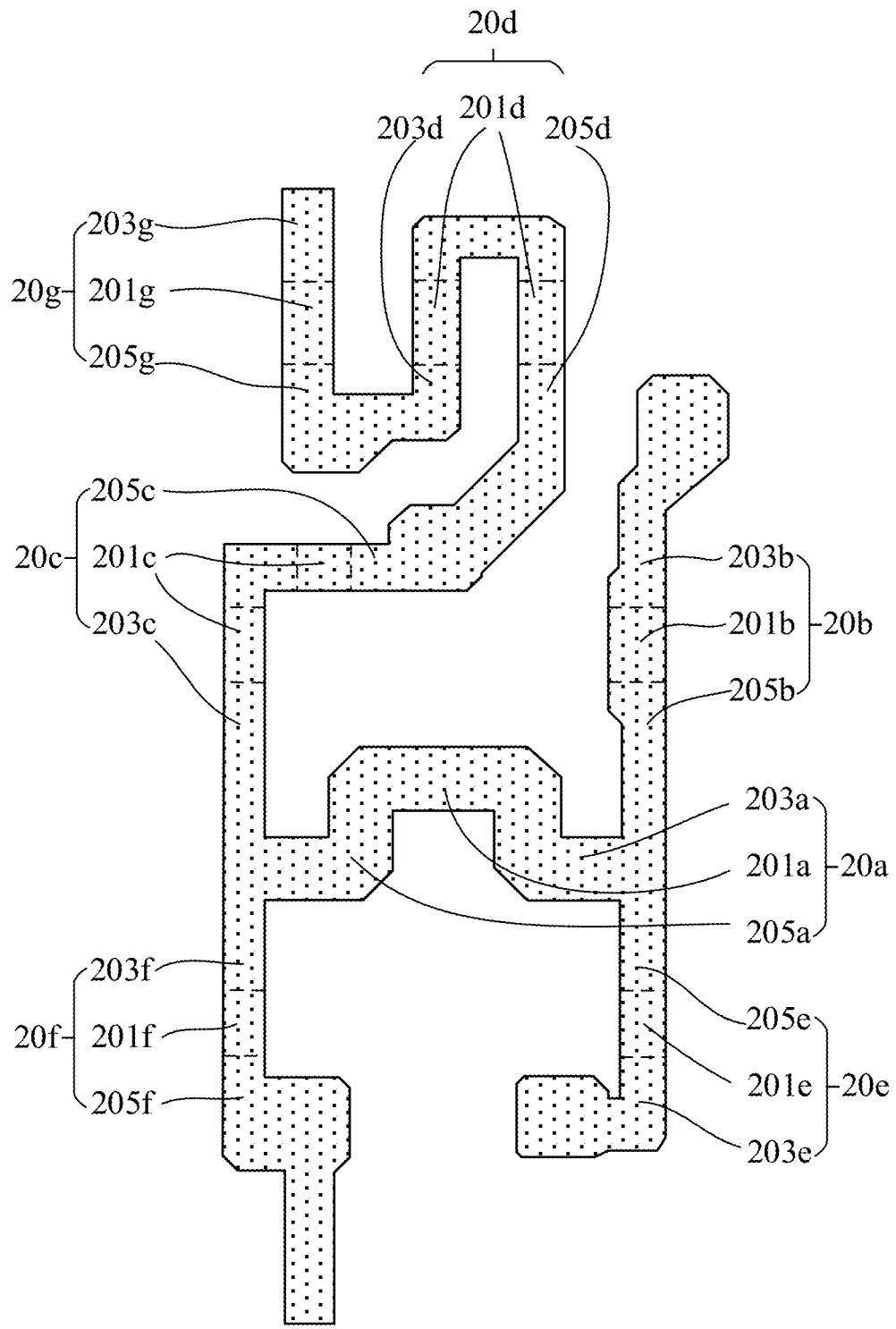
FIGS. 14 to 17 are plan views illustrating some film layers of the exemplary embodiment of the sub-pixels in FIG. 13.

FIG. 13 is a plan view illustrating an exemplary embodiment of sub-pixels in a display area AA of a display substrate according to some embodiments of the present disclosure. FIGS. 14 to 17 are plan views illustrating some film layers of an exemplary embodiment of the sub-pixels in FIG. 13. For example, FIGS. 14 to 17 schematically illustrate a semiconductor layer, a first conductive layer, a second conductive layer, and a third conductive layer, respectively.

With reference to FIGS. 12 to 17, sub-pixels include a scan signal lines 61 arranged in a row direction to apply a scan signal Sn to the sub-pixels, a reset control signal line 62 arranged in a row direction to apply a reset control signal Sn−1 to the sub-pixels, an light-emission control line 63 arranged in a row direction to apply a light-emission control signal En to the sub-pixels, and an initializing voltage line 66 arranged in a row direction to apply an initialization voltage Vint to the sub-pixels. The sub-pixels may include a data line 64 and a driving voltage line 65 that cross a scan signal line 61, a reset control signal line 62, a light-emission control line 63, and an initializing voltage line 66 to respectively apply a data signal Dm and a driving voltage ELVDD to the sub-pixels. The sub-pixels may include: a driving thin film transistor T1, a switching thin film transistor T2, a compensation thin film transistor T3, an initialization thin film transistor T4, a first light-emission control thin film transistor T5, a second light-emission control thin film transistor T6, a bypass thin film transistor T7, a storage capacitor Cst and an organic light-emission diode OLED.

The driving thin film transistor T1, the switching thin film transistor T2, the compensation thin film transistor T3, the initializing thin film transistor T4, the first light-emission control thin film transistor T5, the second light-emitting control thin film transistor T6, and the bypass thin film transistor T7 may be formed along an active layer as shown in FIG. 10. The active layer may have a curved or bent shape, and the active layer may include a driving active layer 20a corresponding to the driving thin film transistor T1, a switching active layer 20b corresponding to the switching thin film transistor T2, a compensation active layer 20c corresponding to the compensation thin film transistor T3, an initialization active layer 20d corresponding to the initialization thin film transistor T4, an operation control active layer 20e corresponding to the first light-emission control thin film transistor T5, a light-emission control active layer 20f corresponding to the second light-emission control thin film transistor T6 and a bypass active layer 20g corresponding to the bypass thin film transistor T7.

The active layer may include, for example, a polysilicon. For example, the active layer may include a channel region, a source region, and a drain region. The channel region may not be doped, or the doping type of the channel region is different from the doping types of the source region and the drain region, and therefore the channel region has semiconductor characteristics. The source region and the drain region are respectively located on both sides of the channel region, and the source region and the drain region are doped with impurities, and therefore the source region and the drain region have conductivity. Impurities may vary depending on whether the TFT is an N-type or P-type transistor.

The driving thin film transistor T1 includes a driving active layer 20a and a driving gate electrode G1. The driving active layer 20a includes a driving source region 203a, a driving drain region 205a, a driving channel region 201a connecting the driving source region 203a and the driving drain region 205a. The driving source region 203a and the driving drain region 205a extend in two opposite directions with respect to the driving channel region 201a. The driving source region 203a of the driving thin film transistor T1 is connected to a switch drain region 205b and an operation control drain region 205e. The driving drain region 205a is connected to a compensation source region 203c and a light-emission control source region 203f. The driving gate electrode G1 of the driving thin film transistor T1 is connected to a compensation gate electrode G3 of the compensation thin film transistor T3 through via holes VAH1 and VAH2 and the first connection line 68.

The switching thin film transistor T2 includes a switching active layer 20b and a switching gate electrode G2. The switch active layer 20b includes a switch channel region 201b, a switch source region 203b, and a switch drain region 205b. The switching thin film transistor T2 is used as a switching device for selecting a target sub-pixel to emit light. The switch gate electrode G2 is connected to the scan signal line 61, the switch source region 203b is connected to the data line 64 through a via hole VAH4, and the switch drain region 205b is connected to the driving thin film transistor T1 and the first light-emission control thin film transistor T5.

The compensation thin film transistor T3 includes a compensation active layer 20c and a compensation gate electrode G3. The compensation active layer 20c includes a compensation channel region 201c, a compensation source region 203c, and a compensation drain region 205c.

The initialization thin film transistor T4 includes an initialization active layer 20d and an initialization gate electrode G4. The initialization active layer 20d includes an initialization channel region 201d, an initialization source region 203d, and an initialization drain region 205d. The initialization source region 203d is connected to the initializing voltage line 66 through a via hole VAH5.

The first light-emission control thin film transistor T5 includes an operation control active layer 20e and an operation control gate electrode G5. The operation control active layer 20e includes an operation control channel region 201e, an operation control source region 203e, and an operation control drain region 205e. The operation control source region 203e may be connected to the driving voltage line 65 through a via hole VAH6.

The second light-emission control thin film transistor T6 includes a light-emission control active layer 20f and a light-emission control gate electrode G6, and the light-emission control active layer 20f includes a light-emission control channel region 201*f*, a light-emission control source region 203*f*, and a light-emission control drain region 205*f*. The light-emission control drain region 205*f* may be connected to the anode of the OLED through a via hole VAH7.

The bypass thin film transistor T7 includes a bypass active layer 20*g* and a bypass gate electrode G7. The bypass active layer 20*g* includes a bypass source region 203*g*, a bypass drain region 205*g*, and a bypass channel region 201*g*. The bypass drain region 205*g* is connected to the initialization source region 203*d* of the initialization thin film transistor T4. The bypass drain region 205*g* may be connected to the initializing voltage line 66 through the via VAH8 and the second connection line 69.

As shown in FIGS. 12 to 17, some signal lines are schematically shown, for example, the scan signal lines 61 arranged in the row direction to apply the scan signal Sn to sub-pixels, the reset control signal line 62 arranged in the row direction to apply the reset control signal Sn−1 to sub-pixels, the light-emission control line 63 arranged in the row direction to apply the light-emission control signal En to sub-pixels, and the initializing voltage line 66 arranged in the row direction to apply the initialization voltage Vint to sub-pixels, the data line 64 and the driving voltage line 65 that cross the scan signal line 61, the reset control signal line 62, the light-emission control line 63 and the initializing voltage line 66 to respectively apply the data signal Dm and the driving voltage ELVDD to sub-pixels.

Figure 18:
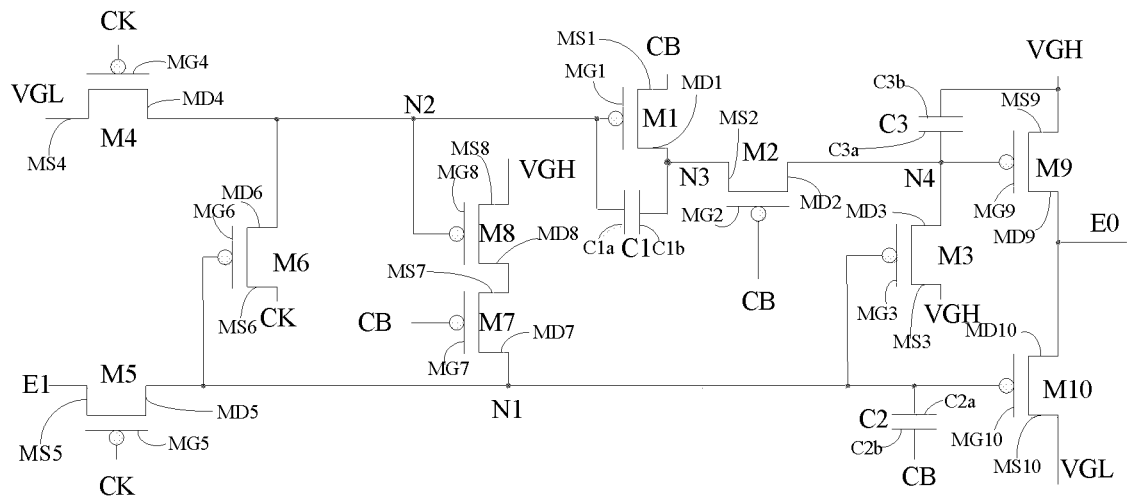
FIG. 18 is a circuit diagram schematically illustrating a first scan driving circuit according to some embodiments of the present disclosure.

In the embodiments of the present disclosure, the GOA circuit may include a first scan driving circuit, for example, the first scan driving circuit may be an EM GOA circuit for transmitting a light-emission control signal En. As shown in FIG. 18, it schematically illustrates a circuit diagram of a first scan driving circuit according to some embodiments of the present disclosure. The first scan driving circuit includes a first voltage signal line VGH, a second voltage signal line VGL, a first clock signal line CK, a second clock signal line CB, and a signal output line E0. The first scan driving circuit further includes a plurality of shift register units.

As shown in FIG. 18, at least one of the plurality of shift register units may include a first capacitor C1, an output capacitor C2, an output reset capacitor C3, an output transistor M10, an output reset transistor M9, a first transistor M1, a second transistor M2, a third transistor M3, a fourth transistor M4, a fifth transistor M5, a sixth transistor M6, a seventh transistor M7, and an eighth transistor M8.

A gate electrode MG10 of the output transistor M10 is coupled to a first plate C2*a* of the output capacitor C2, a first electrode MS10 of the output transistor M10 is coupled to the second voltage signal line VGL, and a second electrode MD10 of the output transistor M10 is coupled to the signal output line E0.

A gate electrode MG9 of the output reset transistor M9 is coupled to the first plate C3*a* of the output reset capacitor C3, a first electrode MS9 of the output reset transistor M9 is coupled to a second plate C3*b* of the output reset capacitor C3, and a second electrode MD9 of the output reset transistor M9 is coupled to the signal output line E0.

The second plate C3*b* of the output reset capacitor C3 is coupled to the first voltage signal line VGH, and the second plate C2*b* of the output capacitor C2 is coupled to the second clock signal line CB.

A first electrode MS1 of the first transistor M1 is coupled to the second clock signal line CB, a second electrode MD1 of the first transistor M1 and a first electrode MS2 of the second transistor M2 are respectively coupled to a second plate C1*b* of the first capacitor C1, a gate electrode MG1 of the first transistor M1 is coupled to a first plate C1*a* of the first capacitor C1.

A gate electrode MG2 of the second transistor M2 and a gate electrode MG7 of the seventh transistor M7 are respectively coupled to the first clock signal line CB, a second electrode MD2 of the second transistor M2 is coupled to a second electrode MD3 of the third transistor M3, and a first electrode MS2 of the second transistor M2 is coupled to a second plate C1*b* of the first capacitor.

A gate electrode MG3 of the third transistor M3 is coupled to a gate electrode MG10 of the output transistor M10, and a first electrode MS3 of the third transistor M3 is coupled to the first voltage signal line VGH.

A gate electrode MG4 of the fourth transistor M4 and a gate electrode MG5 of the fifth transistor M5 are both coupled to the first clock signal line CK, a first electrode MS4 of the fourth transistor M4 and the first electrode MS10 of the output transistor M10 are both coupled to the second voltage signal line VGL, and a second electrode MD4 of the fourth transistor M4 is coupled to a second electrode MD6 of the sixth transistor M6.

The gate electrode MG5 of the fifth transistor M5 is coupled to the first clock signal line CK, a second electrode MD5 of the fifth transistor M5 is coupled to a gate electrode MG6 of the sixth transistor M6, and a first electrode MS5 of the fifth transistor M5 is coupled to an input signal terminal E1.

A first electrode MS1 of the sixth transistor M6 and the gate electrode MG4 of the fourth transistor M4 are both coupled to the first clock signal line CK, the second electrode MD6 of the sixth transistor M6 is coupled to the second electrode MD4 of the fourth transistor M4, and the gate electrode MG6 of the sixth transistor M6 is coupled to a second electrode MD1 of the fifth transistor.

The gate electrode MG7 of the seventh transistor M7 and the second plate C2*b* of the output capacitor C2 are both coupled to the second clock signal line CB, a first electrode MS7 of the seventh transistor M7 is coupled to a second electrode MD8 of the eighth transistor M8, and a second electrode MD7 of the seventh transistor M7 is coupled to the gate electrode MG6 of the sixth transistor M6.

A gate electrode MG8 of the eighth transistor M8 is coupled to the gate electrode MG1 of the first transistor M1, and a first electrode MS8 of the eighth transistor M8 is coupled to the first voltage signal line VGH.

In the embodiments of the shift register unit shown in FIG. 18, all transistors are p-type transistors, but the embodiments of the present disclosure are not limited thereto.

In the embodiments of the present disclosure, a first electrode of a transistor may be a source electrode while a second electrode of a transistor may be a drain electrode; or, a first electrode of a transistor may be a drain electrode while a second electrode of a transistor may be a source electrode.

In FIG. 18, a node labeled N1 is a first node, a node labeled N2 is a second node, a node labeled N3 is a third node, and a node labeled N4 is a fourth node.

In the embodiments shown in FIG. 18, the first voltage signal line VGH may provide a high voltage VGH, and the second voltage signal line VGL may provide a low voltage VGL, but the embodiments are not limited to this.

Figure 19:
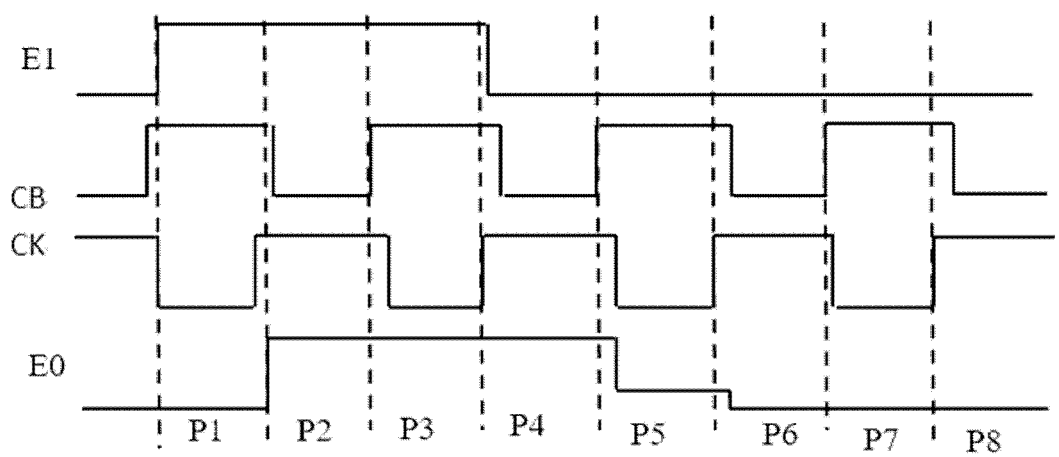
FIG. 19 is a sequence diagram of the scan driving circuit in FIG. 18.

FIG. 19 is a sequence diagram of the scan driving circuit shown in FIG. 18. With reference to FIG. 18 and FIG. 19, an operation process of the shift register unit shown in FIG. 18 is exemplified.

In first time period P1, E1 provides high level, CK provides low level, CB provides high level, the M5 and the M4 are turned on, a potential of the N1 is high level, the M6 is turned off, a potential of the N2 is low level, so the M7, the M3 and the M10 are turned off, the M8 and the M1 are turned on; at this time, a potential of the N3 is high level and the CB provides high level, so the M2 is turned off; since a voltage across capacitor does not change suddenly, a potential of the N4 is maintained at high level of previous frame, the M9 is turned off, and a potential of the light-emission control signal output by the E0 is maintained at low level of previous frame.

In second time period P2, the E1 and the CK provide high level, the CB provides low level, the M5, the M6 and the M4 are turned off, the potential of the N1 remains high level, the potential of the N2 remains low level, the M7, the M8 and the M1 are turned on, the potential of the N3 changes from high level to low level, the M2 is turned on, the potential of the N4 is low level, the M9 is turned on, and the E0 outputs high level; the M3 and the M10 are turned off.

In third time period P3, the E1 and the CB provide high level, the CK provides low level, the M5 and the M4 are turned on, the potential of the N1 is high, the potential of the N2 is low, and the M6 and the M7 are turned off, the M8 and the M1 are turned on, the potential of the N3 changes from the low level of the previous period to the high level, the M2 is turned off, the potential of the N4 remains low level, the M9 is turned on, and the E0 outputs high level; the M3 and the M10 are turned off.

In fourth time period P4, the E1 and the CB provide low level, the CK provides high level, the M5 and the M4 are turned off, the potential of the N1 is high level, the M6 is turned off, the potential of the N2 is maintained at low level; the M7, the M8 and the M1 are turned on, a voltage of the N3 changes to low level, the M2 is turned on, the potential of the N4 is low level, the M9 is turned on, the E0 outputs high level; the M3 and the M10 are turned off.

In fifth time period P5, the E1 and the CK provide low level, the CB provides high level, the M5, the M6, and the M4 are turned on, the potentials of the N1 and the N2 are both low level, the M7 is turned off, the M7 and the M1 are turned on, the voltage of the N3 becomes high level, the M2 is turned off, the M3 is turned on, a voltage of the N4 becomes high level, the M9 is turned off, the M10 is turned on, and the E0 outputs a low level.

In sixth time period P6, the E1 and the CB signals are at low level, the CK is at high level, the M1 and the M3 are turned off, the N1 remains low level, the M2 is turned on, a voltage of the N2 is at high level, and the M4 and the M5 are turned on, the M6 is turned off, the N3 is high level, the M7 and M8 are turned on, the N4 is high level, the M9 is turned off, the M10 is turned on, and the E0 outputs low level.

In seventh time period P7, the E1 and the CK provide low level, the CB provides high level, the M5, the M6 and the M4 are turned on, the potential of the N1 and the N2 are low level, the M7 is turned off, the M8 and the M1 are turned on, the potential of the N3 is high level, the M2 is turned off, the M3 is turned on, the potential of the N4 is high level, the M9 is turned off, the M10 is turned on, and the E0 outputs low level.

In eighth time period P8, the E1 and the CB provide low level, the CK provides high level, the M5 and the M4 are turned off, the potential of the N1 is maintained at low level, the M6 is turned on, the potential of the N2 is high level, and the M7 is turned on, the M8 and the M1 are turned off, the potential of the N3 is high level, the M2 and the M3 are turned on, the voltage of the N4 is high level, the M9 is turned off, the M10 is turned on, and the E0 outputs low level.

After the sixth time period P6, the M3 is continuously turned on, the M9 is continuously turned off, the M5 periodically charges the C2, the potential of the N1 remains low level, the M10 is continuously turned on, and the E0 outputs low level until the next frame E1 receives input signal.

In exemplary embodiments of the present disclosure, the GOA circuit may include a second scan driving circuit, for example, the second scan driving circuit may be a GATE GOA circuit for transmitting a scan signal Sn and/or a reset control signal Sn−1. For example, the GATE GOA circuit may correspond to pixel rows one to one, that is, one GATE GOA circuit corresponds to one row of pixels, in this case, a signal output by one GATE GOA circuit may be used as a scan signal of one row of pixels corresponding to the row of GATE GOA circuit, and also used as a reset control signal of next row of pixels. In other words, a scan signal of a row of pixels comes from a signal output by the GATE GOA circuit corresponding to the row of pixels, and a reset control signal of the row of pixels comes from a signal output from the GATE GOA circuit corresponding to previous row of pixels. It should be noted that, for EM GOA circuit, there may be two rows or four rows driving method, that is, an output signal of one EM GOA circuit may be used to drive two or four rows of pixels.

Figure 20:
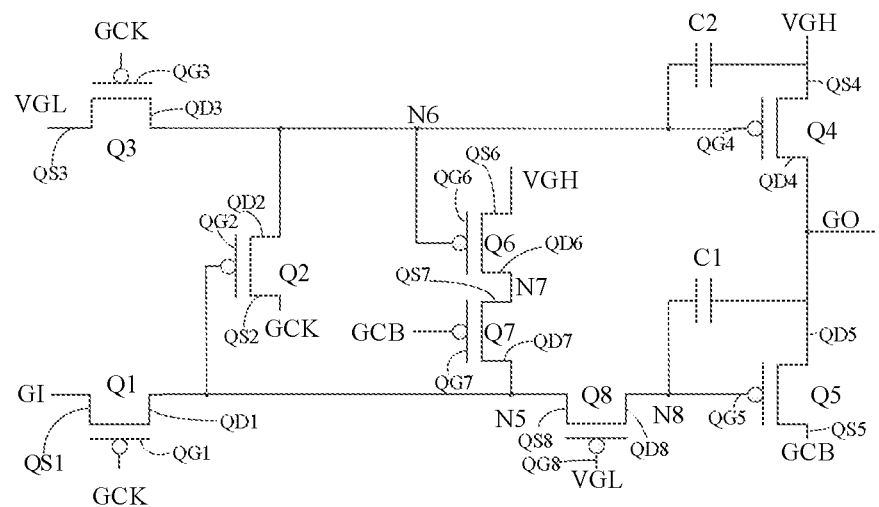
FIG. 20 is a circuit diagram schematically illustrating a second scan driving circuit according to some embodiments of the present disclosure.

As shown in FIG. 20, a circuit diagram of a second scan driving circuit according to some embodiments of the present disclosure is schematically illustrated. The second scan driving circuit includes a first voltage signal line VGH, a second voltage signal line VGL, a third clock signal line GCK, a fourth clock signal line GCB, and a signal output line GO. The second scan driving circuit further includes a plurality of shift register units.

As shown in FIG. 20, at least one of the plurality of shift register units may include a first capacitor C1, a second capacitor C2, a first transistor Q1, a second transistor Q2, a third transistor Q3, a fourth transistors Q4, a fifth transistor Q5, a sixth transistor Q6, a seventh transistor Q7, and a eighth transistor Q8.

A gate electrode QG1 of the first transistor Q1 is coupled to the clock signal line GCK, a first electrode QS1 is coupled to an input signal terminal GI, and a second electrode QD1 is coupled to a gate electrode QG2 of the second transistor Q2.

A first electrode QS2 of the second transistor Q2 is coupled to the clock signal line GCK, and a second electrode QD2 is coupled to a sixth node N6.

A gate electrode QG3 of the third transistor Q3 is coupled to the clock signal terminal GCK, a first electrode QS3 is coupled to the voltage signal line VGL, and a second electrode QD3 is coupled to the sixth node N6.

A gate electrode QG4 of the fourth transistor Q4 is coupled to the sixth node N6, a first electrode QS4 is coupled to the voltage signal line VGH, and a second electrode QD4 is coupled to the signal output line GO.

A gate electrode QG5 of the fifth transistor Q5 is coupled to an eighth node N8, a first electrode QS5 is coupled to the clock signal terminal QCB, and a second electrode QD5 is coupled to the signal output line GO.

A gate electrode QG6 of the sixth transistor Q6 is coupled to the sixth node N6, a first electrode QS6 is coupled to the voltage signal line VGH, and a second electrode QD6 is coupled to a seventh node N7.

A gate electrode QG7 of the seventh transistor Q7 is coupled to the clock signal terminal GCB, a first electrode QS7 is coupled to the seventh node N7, and a second electrode QD7 is coupled to a fifth node N5.

A gate electrode QG8 of the eighth transistor Q8 is coupled to the voltage signal line VGL, a first electrode QS8 is coupled to the fifth node N5, and a second electrode QD8 is coupled to the eighth node N8.

One end of the first capacitor C1 is coupled to the eighth node N8, and the other end of the first capacitor C1 is coupled to the second electrode QD5 of the fifth transistor Q5. One end of the second capacitor C2 is coupled to the sixth node N6, and the other end of the second capacitor C2 is coupled to the first electrode QS4 of the fourth transistor Q4.

Figure 21:
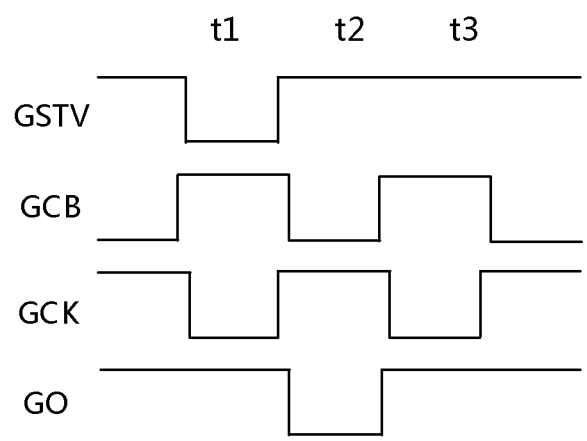
FIG. 21 is a sequence diagram of the scan driving circuit in FIG. 20.

With reference to the sequence diagrams of FIG. 20 and FIG. 21, an operation process of the shift register unit shown in FIG. 20 is exemplified.

In time period t1, the second scan driving circuit receives a low potential pulse GSTV output by previous stage, a alternating signal GCK is at low level, at this time, the transistors Q1, Q2, Q3, Q4, Q5, Q6, and Q8 are turned on, and the signal output line GO outputs high level.

In time period t2, potentials of GCK and GCB are reversed, and only the transistors Q2, Q5 and Q7 are turned on, at this time, a low-level signal GCB is output to the signal output line GO through the transistor Q5, the transistor Q4 is turned off, so the voltage signal VGH may not be output and the signal output line GO outputs low level.

In time period t3, GCK becomes low level, GCB becomes high level, and the signal output line GO outputs high level.

That is, only in the time period t2, the signal output line GO outputs the low level.

Figure 22:
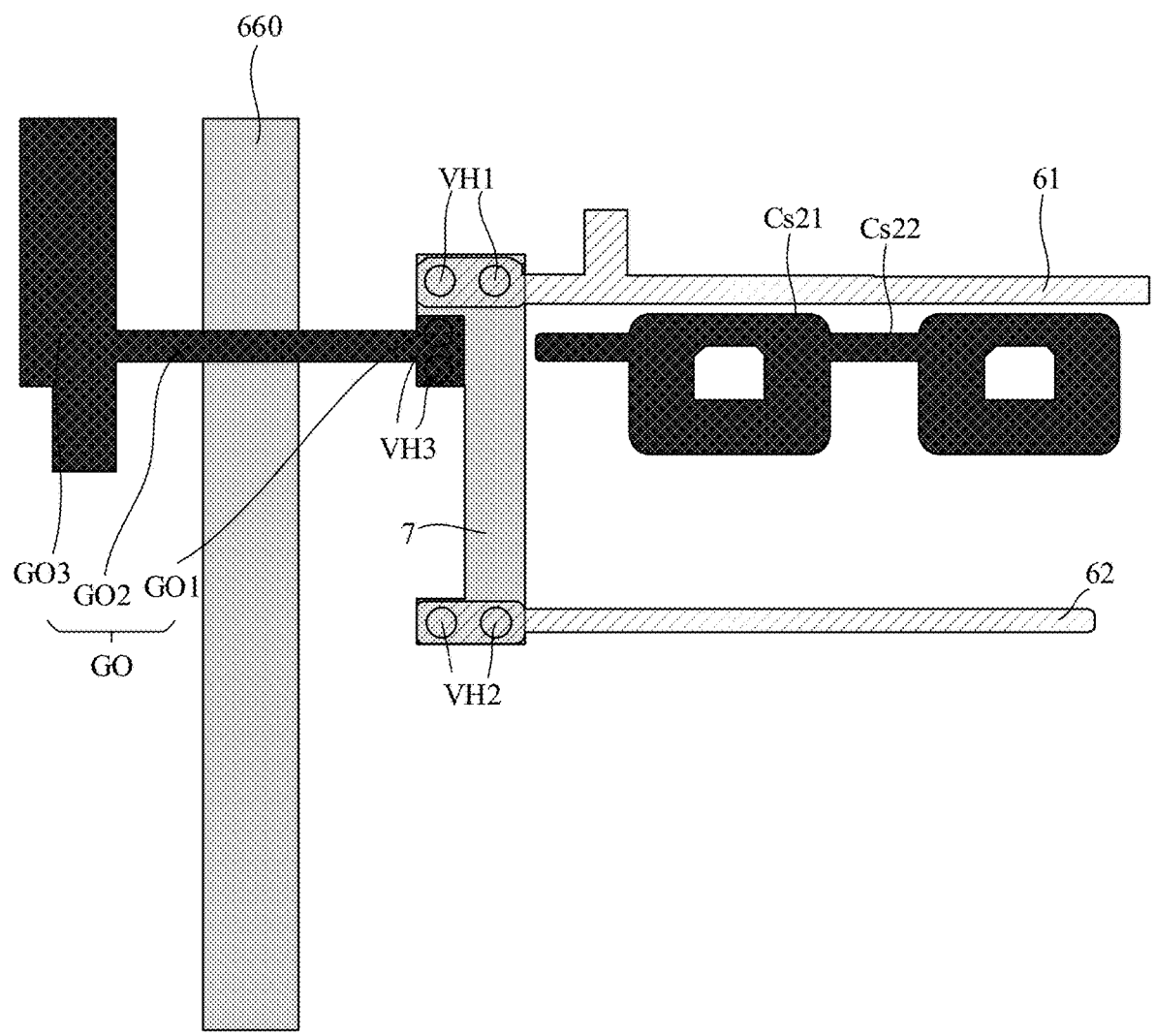
FIG. 22 is an enlarged view of the signal line transfer structure of the display substrate according to some embodiments of the present disclosure.

FIG. 22 is an enlarged view of a signal line transfer structure of a display substrate according to some embodiments of the present disclosure. Referring to FIGS. 13, 15, 20 and 22, the signal line transfer structure 7 is configured to transfer the signal output line GO of the second scan driving circuit to the scan signal line 61 and the reset control signal line 62, that is, the signal line transfer structure 7 is configured to transfer gate scan signal and reset control signal.

Figure 24:
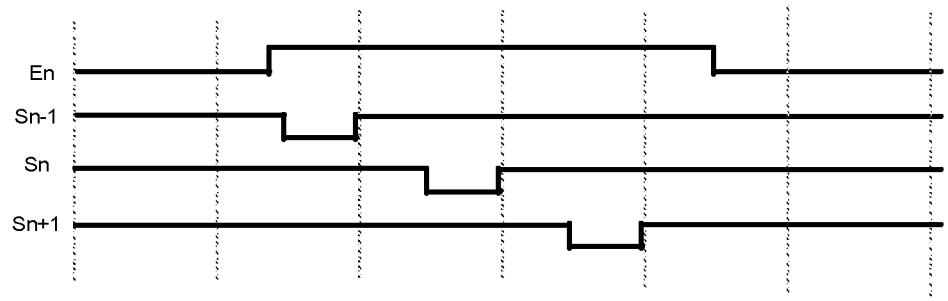
FIG. 24 is a sequence diagram of light-emission control signals, scan signals, and reset control signals for driving multiple rows of adjacent pixels of a display substrate according to some embodiments of the present disclosure.

FIG. 24 is a timing diagram of light-emission control signals, scan signals, and reset control signals for driving multiple adjacent rows of pixels of a display substrate according to some embodiments of the present disclosure. As mentioned above, an output signal of one EM GOA circuit may be used to drive two or four rows of pixels. Then, a light-emission control signal En shown in FIG. 24 may be used to drive adjacent rows of pixels (such as two or four rows), for example, the light-emission control signal En may be used as light-emission control signals for pixel driving circuits of pixels in $n^{th}$ row and $(n+1)^{th}$ row, or the light-emission control signal En may be used as the light-emission control signals for the pixel driving circuits of the pixels in $n^{th}$ row, $(n+1)^{th}$ row, $(n+2)^{th}$ row, and $(n+3)^{th}$ row. A scan signal for a certain row of pixels comes from signal output by the GATE GOA circuit corresponding to the row of pixels, and a reset control signal for the row of pixels comes from signal output by the GATE GOA circuit corresponding to previous row of pixels. Then, the signal Sn−1 shown in FIG. 24 may be used as scan signal for the pixel driving circuits of pixels in $(n-1)^{th}$ row, and the signal Sn−1 may be used as reset control signal for the pixel driving circuits of pixels in $n^{th}$ row. The signal Sn shown in FIG. 24 may be used as scan signal for the pixel driving circuits of pixels in $n^{th}$ row, and the signal Sn may be used as reset control signal for the pixel driving circuits of pixels in $(n+1)^{th}$ row. The scan signal Sn+1 shown in FIG. 24 may be used as scan signal for the pixel driving circuits of pixels in $(n+1)^{th}$ row, and the signal Sn+1 may be used as reset control signal for the pixel driving circuits of pixels in $(n+2)^{th}$ row.

With reference to FIG. 22, the signal line transfer structure 7 is used for transferring the signal output line GO of the second scan driving circuit (i.e., the GATE GOA circuit) to the scan signal line 61 and the reset control signal line 62. The signal output by the signal output line GO may be the Sn signal as shown in FIG. 24, so that the Sn signal transmitted by the scan signal line 61 may be used as the scan signal for the pixel driving circuits of the pixels in the $n^{th}$ row, and the Sn signal transmitted by the reset control signal line 62 may be used as the reset control signal for the pixel driving circuits of the pixels in the $(n+1)^{th}$ row.

Figure 23:
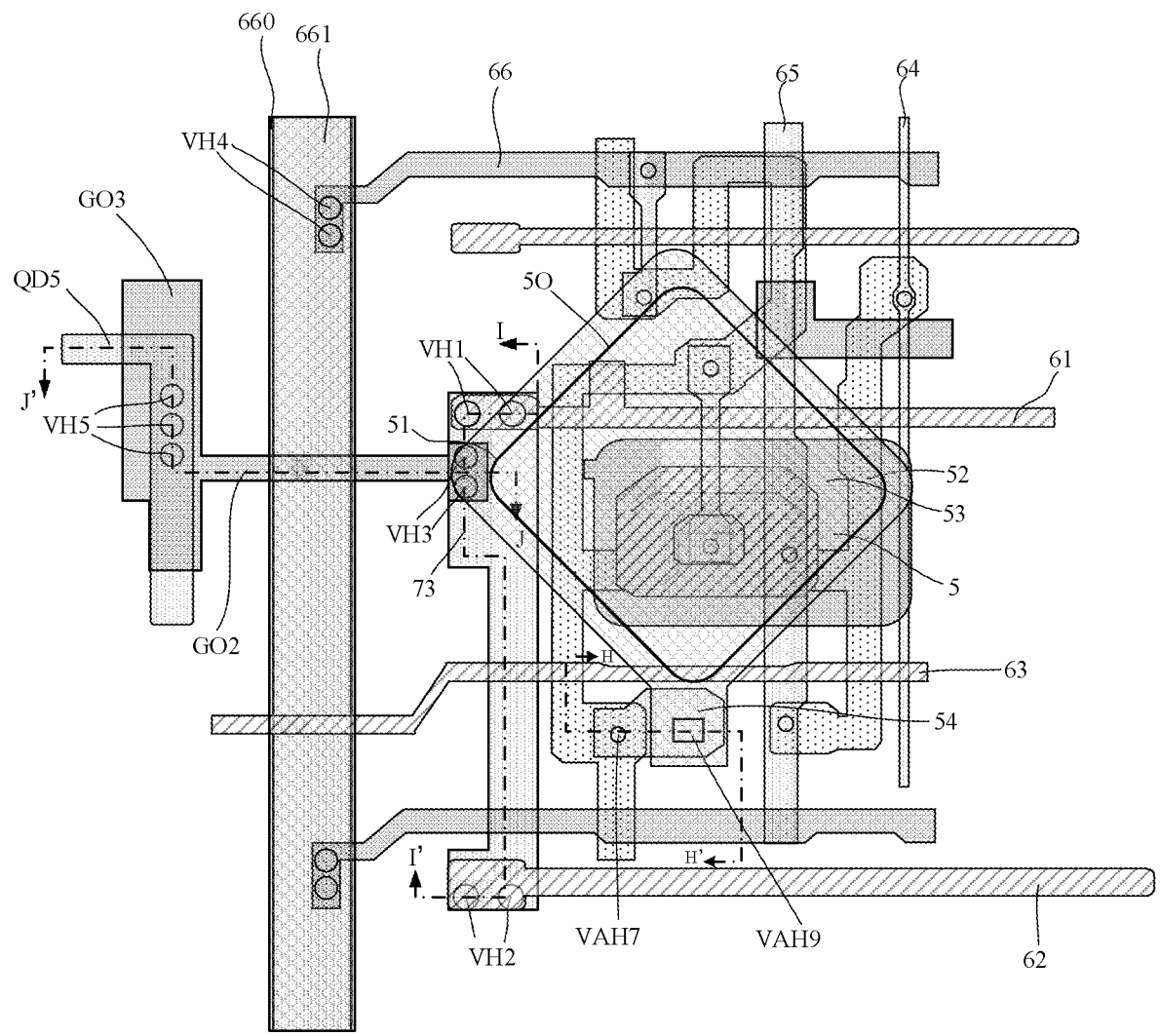
FIG. 23 is a plan view of a display substrate according to some embodiments of the present disclosure, in which film layer structures such as a signal line transfer structure and an anode layer are illustrated.
Figure 25:
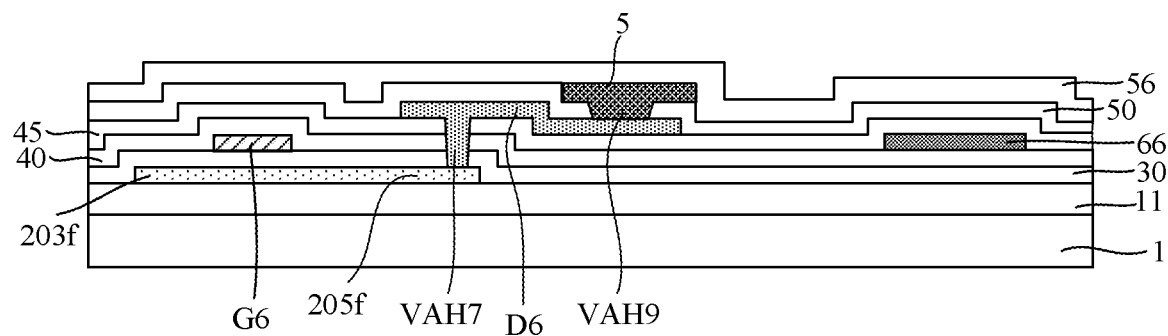
FIG. 25 is a schematic cross-sectional view of the display panel taken along line HH' in FIG. 23 according to some embodiments of the present disclosure.
Figure 27:
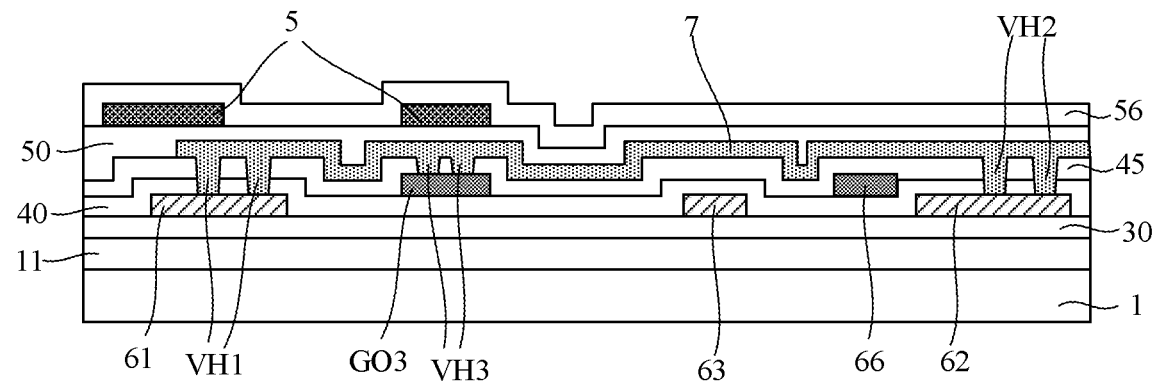
FIG. 27 is a schematic cross-sectional view of the display panel taken along line II' in FIG. 23 according to some embodiments of the present disclosure.
Figure 28:
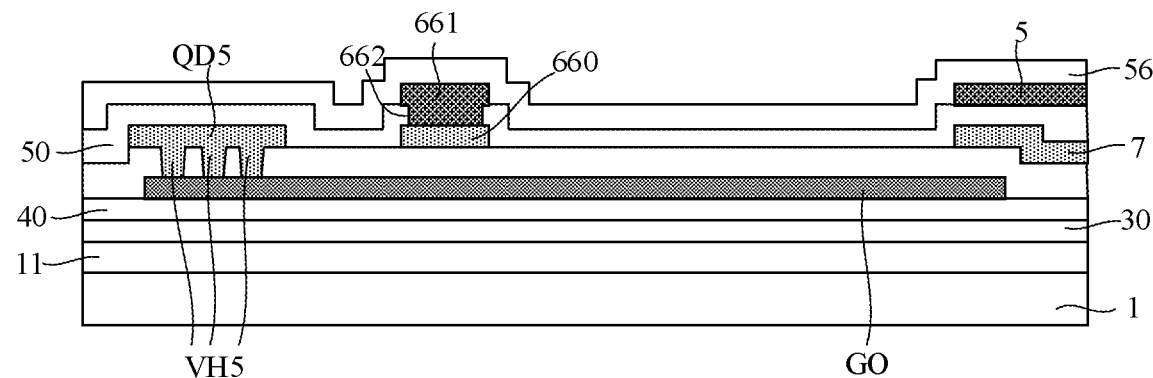
FIG. 28 is a schematic cross-sectional view of the display panel taken along line JJ' in FIG. 23 according to some embodiments of the present disclosure.

FIG. 23 is a plan view of a display substrate according to some embodiments of the present disclosure, in which some film layer structures such as a signal line transfer structure and an anode layer are shown. FIG. 25 is a schematic cross-sectional view of the display panel according to some embodiments of the present disclosure taken along line HH' in FIG. 23. FIG. 27 is a schematic cross-sectional view of the display panel according to some embodiments of the present disclosure taken along line II' in FIG. 23. FIG. 28 is a schematic cross-sectional view of the display panel according to some embodiments of the present disclosure taken along line JJ' in FIG. 23.

With reference to FIGS. 12, 13 to 17, FIG. 23, FIG. 25, FIG. 27, and FIG. 28, the insulating layer may include at least some insulating layers selected from a gate insulating layer 30, a first interlayer insulating layer 40, a second interlayer insulating layer 45 and a first planarization layer 50.

With reference to FIGS. 23 and 25, the display substrate may include: an active layer 20 (a layer where a light-emission control source region 203f and a light-emission control drain region 205f in FIG. 25 are located) on the base substrate 1, a gate insulating layer 30 on a side of the active layer 20 away from the base substrate 1, a gate electrode G6 on a side of the gate insulating layer 30 away from the base substrate 1, a first interlayer insulating layer 40 on a side of the gate electrode G6 away from the base substrate 1, an initializing voltage line 66 on a side of the first interlayer insulating layer 40 away from the base substrate 1, a second interlayer insulating layer 45 on a side of the initializing voltage line 66 away from the base substrate 1, a drain electrode D6 on a side of the second interlayer insulating layer 45 away from the base substrate 1, a first planarization layer 50 covering the drain electrode D6, and an anode 5 on a side of the first planarization layer 50 away from the base substrate 1. The drain electrode D6 may be connected to the light-emission control drain region 205f through a via hole VAH7, and the anode 5 may be connected to the drain electrode D6 through a via hole VAH9.

Figure 15:
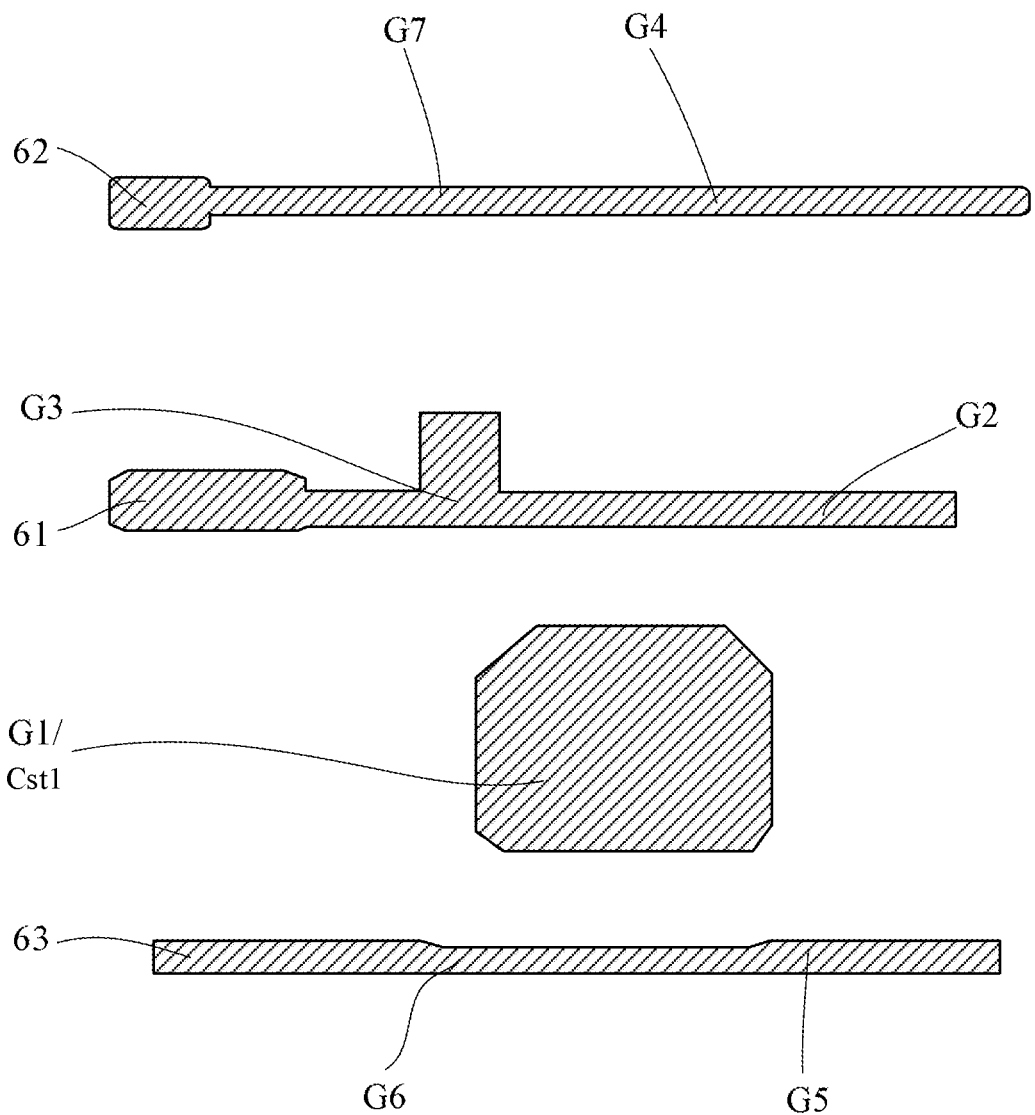
Figure 16:
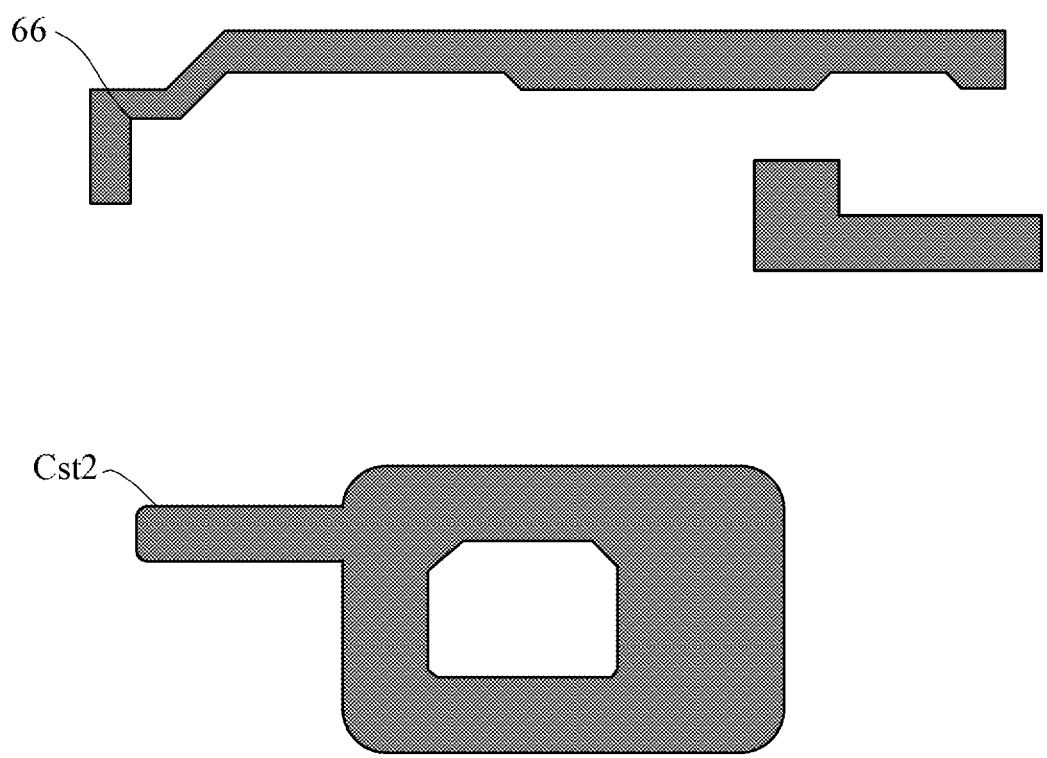
Figure 17:
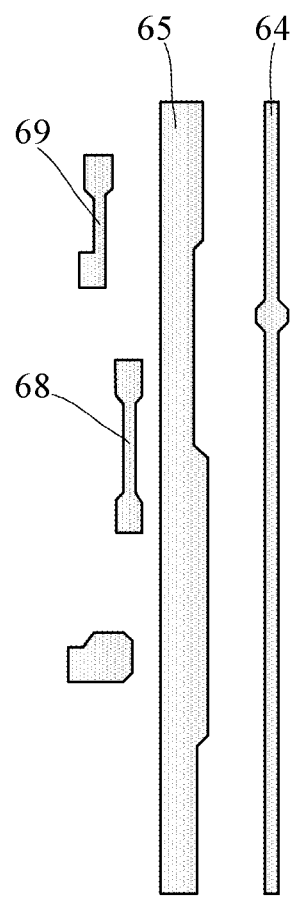

Referring to FIGS. 15 and 16, the display substrate may further include a first capacitor electrode Cst1 and a second capacitor electrode Cst2. Referring to FIG. 13 in combination, the first capacitor electrode Cst1 and the second capacitor electrode Cst2 are opposed to each other and may be spaced apart from each other by the first interlayer insulating layer 40 to form a storage capacitor Cst.

In the illustrated examples, conductive elements such as the first capacitor electrode Cst1 and the gate electrode G6 may be located in the same layer, for example, the conductive elements are formed by the same patterning process. For the convenience of description, the layer where the first capacitor electrode Cst1 and the gate G6 are located may be referred to as a first conductive layer. Conductive elements such as the second capacitor electrode Cst2 and the initializing voltage line 66 may be located in the same layer, for example, the conductive elements are formed by the same patterning process. For the convenience of description, the layer where the second capacitor electrode Cst2 and the initializing voltage line 66 are located may be referred to as a second conductive layer. The layer where the drain electrode D6 is located may be referred to as a third conductive layer. For example, conductive elements such as the driving voltage line 65 and/or the data line 64 may be located in the third conductive layer.

It should be understood that conductive elements of the first scan driving circuit, the second scan driving circuit, and various signal lines may be arranged in the first conductive layer, the second conductive layer, and the third conductive layer, respectively.

Optionally, a buffer layer 11 may be provided between the semiconductor layer 20 and the base substrate 1.

Specifically, referring to FIG. 27, the scan signal line 61 and the reset control signal line 62 may be located in the first conductive layer, that is, located in the layer where gate electrodes of the thin film transistors are located. Referring to FIG. 28, the signal output line GO of the second scan driving circuit may be located in the second conductive layer. Referring to FIGS. 27 and 28, the signal line transfer structure 7 may be located in the third conductive layer. In FIG. 22, the initializing voltage signal line 660 is also schematically shown, and the initializing voltage signal line 660 may be located in the third conductive layer.

For example, the initializing voltage signal line 660 may cross the signal output line GO of the second scan driving circuit, that is, a projection of the initializing voltage signal line 660 on the base substrate may partially overlaps a projection of the the signal output line GO on the base substrate. For example, the signal output line GO is located in a peripheral area and on first side of a display area in a row direction, and the signal output line GO extends toward the display area. The initializing voltage signal line 660 is located in the peripheral area and on the first side of the display area in the row direction, and the initializing voltage signal line 660 extends along an outline direction of a boundary of the display area on the first side. For example, the signal output line GO crosses the initializing voltage signal line 660, and extends into the display area or extends to a position that is closer to the display area than the initializing voltage signal line 660. The signal output line GO is electrically connected to the signal line transfer structure 7. Exemplarily, two via holes VH3 are shown in FIG. 22, the signal output line GO of the second scan driving circuit may be electrically connected to the signal line transfer structure 7 through two via holes VH3. Specifically, referring to FIG. 27, the signal output line GO is located in the second conductive layer, the signal line transfer structure 7 is located in the third conductive layer, and the signal output line GO and the signal line transfer structure 7 in different layers are electrically connected to each other through two via holes VH3. In this way, an electrical connection between the signal output line GO and the signal line transfer structure 7 in different layers is realized.

Exemplarily, two via holes VH3 may be arranged in a direction parallel to an extending direction of the initializing voltage signal line 660, that is, in the up-down direction (column direction) in FIG. 22. It should be understood that the number of the via holes VH3 is not limited to two, and more via holes VH3 may also be provided. By providing a plurality of via holes VH3, a contact area between the signal output line GO and the signal line transfer structure 7 may be increased, thereby realizing a good electrical connection between the signal output line GO and the signal line transfer structure 7.

Further, referring to FIGS. 23 and 27, a first end of the signal line transfer structure 7 is electrically connected to the scan signal line 61 through two via holes VH1. In this way, an electrical connection between the signal line transfer structure 7 and the scan signal line 61 located in different layers is realized.

Exemplarily, two via holes VH1 may be arranged in a direction perpendicular to the extending direction of the initializing voltage signal line 660, that is, in the left-right direction in FIG. 22. It should be understood that the number of via holes VH1 is not limited to two, and more via holes VH1 may also be provided. By providing a plurality of via holes VH1, a contact area between the signal line transfer structure 7 and the scan signal line 61 may be increased, thereby realizing a good electrical connection between the signal line transfer structure 7 and the scan signal line 61.

Further, referring to FIGS. 23 and 27, a first end of the same signal line transfer structure 7 connected to one GOA unit is electrically connected to the scan signal line 61 through the two via holes VH1, and a second end thereof is electrically connected to the reset control signal line 62 through two via holes VH2. In this way, a electrical connection between the signal line transfer structure 7 and the reset control signal line 62 located in different layers is realized.

Exemplarily, two via holes VH1 may be arranged in a direction perpendicular to the extending direction of the initializing voltage signal line 660, and two via holes VH2 may be arranged in the direction perpendicular to the extending direction of the initializing voltage signal line 660, that is, in the left-right direction (row direction) in FIG. 22. It should be understood that the number of via holes VH2 is not limited to two, and more via holes VH2 may also be provided. By providing a plurality of via holes VH2, a contact area between the signal line transfer structure 7 and the reset control signal line 62 may be increased, thereby realizing a good electrical connection between the signal line transfer structure 7 and the reset control signal line 62.

As shown in FIG. 22, the first end and the second end of the signal line transfer structure 7 are respectively located on opposite sides, or in other words, are respectively located on two sides of the signal output line GO (for example, two sides in the column direction). Through the signal line transfer structure 7, an electrical connection between the signal output line GO and the scan signal line 61 located in different layers as well as an electrical connection between the signal output line GO and the reset control signal line 62 located in different layers may be realized. Thus, the gate scan signal and the reset control signal generated by the second scan driving circuit are transmitted to the pixel driving circuit.

A signal output line GO may include three sections, which are respectively marked as a first sub-section of signal output line GO1, a second sub-section of signal output line GO2, and a third sub-section of signal output line GO3, for convenience of description. An orthographic projection of the first sub-section of signal output line GO1 on the base substrate at least partially overlaps with an orthographic projection of the signal line transfer structure 7 on the base substrate, so as to implement via-hole connection. The second sub-section of signal output line GO2 crosses the initializing voltage signal line 660, that is, an orthographic projection of the second sub-section of signal output line GO2 on the base substrate at least partially overlaps with an orthographic projection of the initializing voltage signal line 660 on the base substrate. For example, an extending direction of the second sub-section of signal output line GO2 is substantially perpendicular to an extending direction of the initializing voltage signal line 660. For example, an orthographic projection of the second sub-section of signal output line GO2 on the base substrate partially overlaps with an orthographic projection of the initializing voltage signal line 660 on the base substrate, and an area of the overlapped portion is obtained by multiplying a line width of the second sub-section of signal output line GO2 by a line width of the initializing voltage signal line 660. Referring to FIG. 23 in combination, an orthographic projection of the third sub-section of signal output line GO3 on the base substrate at least partially overlaps with an orthographic projection of the second electrode QD5 of the fifth transistor Q5 of the second scan driving circuit on the base substrate. In a direction parallel to the extending direction of the initializing voltage signal line 660 (for example, the column direction), a size of the first sub-section of signal output line GO1 is smaller than a size of the third sub-section of signal output line G03, a size of the second sub-section of signal output line GO2 is smaller than a size of each of the first sub-section of signal output line GO1 and the third sub-section of signal output line G03.

Continue to refer to FIG. 22, the second capacitor electrode Cst2 may include a second capacitor electrode body portion Cs21 and a second capacitor electrode connecting portion Cs22 for connecting the second capacitor electrode body portion Cs21. That is, the second capacitor electrode connecting portion Cs22 is provided between every two adjacent second capacitor electrode body portions Cs21.

In a direction perpendicular to the extending direction of the initializing voltage signal line 660, the second sub-section of signal output line GO2 and the second capacitor electrode connecting portion Cs22 are substantially aligned with each other. For example, a projection of the second sub-section of signal output line GO2 in the direction perpendicular to the extending direction of the initializing voltage signal line 660 at least partially overlaps with a projection of the second capacitor electrode connecting portion Cs22 in the direction perpendicular to the extending direction of the initializing voltage signal line 660.

Referring to FIG. 23, an anode 5 of an edge sub-pixel is schematically illustrated. The anode 5 includes a body portion 53 and a connecting portion 54, the body portion 53 covers an opening of the sub-pixel, and the connecting portion 54 covers a via hole VAH9 for connecting the anode 5 to other conductive portions (for example, drain electrode D6). For example, an orthographic projection of the body portion 53 on the base substrate may have a regular shape, such as rounded rectangle described in FIG. 23. The body portion 53 may have a center, for example, the center may be an intersection of two diagonal lines of the rounded rectangle. As described above, the anode 5 includes a first edge portion 51 and a second edge portion 52, the first edge portion 51 and the second edge portion 52 do not overlap with the center of the body portion 53. Specifically, the first edge portion 51 and the second edge portion 52 are respectively located on both sides of the center of the body portion 53 in a row direction, and both the first edge portion 51 and the second edge portion 52 are spaced apart from the center of the body portion 53 in the row direction. For example, a size of each of the first edge portion 51 and the second edge portion 52 in the row direction may be ⅒ to ⅕ of a size of the body portion 53 in the row direction.

An orthographic projection of the anode 5 of the edge sub-pixel on the base substrate 1 at least partially overlaps with an orthographic projection of the signal line transfer structure 7 on the base substrate 1, wherein the signal line transfer structure 7 is connected to a pixel driving circuit (for example, a scan signal line or a reset control signal line) of a pixel where the anode 5 of the edge sub-pixel is located. The signal line transfer structure 7 is located below the first edge portion 51 of the anode 5, and the driving voltage line 65 and the data line 64 are provided below the second edge portion 52 of the anode 5. In other words, an orthographic projection of the first edge portion 51 on the base substrate 1 at least partially overlaps with an orthographic projection of the signal line transfer structure 7 on the base substrate 1, and an orthographic projection of the driving voltage line 65 and/or the data line 64 on the base substrate 1 at least partially overlaps with an orthographic projection of the second edge portion 52 on the base substrate 1. For the anode 5 of the same one edge sub-pixel, a first portion of the anode 5 and a second portion of the anode 5 are located on two sides with regard to a center line of the anode of the edge sub-pixel, for example, on two opposite edges on left and right sides (row direction), wherein an orthographic projection of the first portion of the anode 5 on the base substrate 1 overlaps with an orthographic projection of the signal line transfer structure 7 that is connected to a pixel driving circuit (for example, a scan signal line or a reset control signal line) of a pixel where the anode 5 is located on the base substrate 1, and an orthographic projection of the second portion of the anode 5 on the base substrate 1 overlaps with an orthographic projection of the driving voltage line 65 and/or the data line 64 on the base substrate 1.

As shown in FIG. 23, an orthographic projection of the signal line transfer structure 7 overlapping with the edge sub-pixel on the base substrate 1 passes through the orthographic projection of the anode 5 of the edge sub-pixel on the base substrate 1.

It should be noted that the expression "pass through" herein means that at least a part of two ends of the signal line transfer structure 7 in the column direction does not overlap with the anode 5, or in other words, a line in the column direction on the signal line transfer structure 7 passes through the anode 5.

Referring to FIGS. 23 and 25 in combination, the display substrate further includes a pixel defining layer 56 located on a side of the anode 5 away from the base substrate 1. The pixel defining layer 56 includes an opening 50, and the anode 5 is at least partially exposed by the opening 50.

As shown in FIG. 23, a size of the signal line transfer structure 7 extending in the column direction is larger than a size of the opening 50 of the pixel defining layer 56 extending in the column direction.

A size of the pixel driving circuit corresponding to the sub-pixel in the column direction is marked as a, and a size of the signal line transfer structure 7 in the column direction is between ⅓a and a, or the size of the signal line transfer structure 7 in the column direction is between ½a and a, or the size of the signal line transfer structure 7 in the column direction is between ½a and ¾a.

It should be noted that the expression "the size of the pixel driving circuit in the column direction" herein may be understood as follows: a distance in the column direction between two signal lines that transmit the same signal, with a startpoint on one signal line that extends in the row direction and drives sub-pixels in previous row and an endpoint on another signal line that drives sub-pixels in current row and transmits the same signal as the one signal line. For example, "the size of the pixel driving circuit in the column direction" may be the distance in the column direction between a reset control signal line for sub-pixels in previous row and a reset control signal line for sub-pixels in current row.

As shown in FIG. 23, the size of the signal line transfer structure 7 in the column direction is larger than a spacing in the column direction between the scan signal line 61 and the light-emission control line 63 in the pixel driving circuit connected to the signal line transfer structure 7.

As shown in FIG. 23, in a direction perpendicular to the driving voltage line 65 and the data line 64 (for example, the row direction), the signal line transfer structure 7 is located on a side that is closer to the non-display area than the driving voltage line 65 and the data line 64.

In the embodiments of the present disclosure, the data line 64, the driving voltage line 65 and the signal line transfer structure 7 are located in the same layer as the source/drain electrodes of the thin film transistor, that is, the data line 64, the driving voltage line 65 and the signal line transfer structure 7 may be composed of materials constituting the source/drain electrodes and formed by the same patterning process. In this way, thicknesses of the data line 64, the driving voltage line 65 and the signal line transfer structure 7 are approximately equal to one another, that is, a thickness of the signal line transfer structure 7 in a direction perpendicular to the base substrate 1 is approximately equal to a thickness of each of the data line 64 and the driving voltage line 65 in a direction perpendicular to the base substrate 1. For example, the expression "approximately equal to" may mean a range from 0.8 to 1.2, that is, a ratio of "the thickness of the signal line transfer structure 7 in the direction perpendicular to the base substrate 1" to "thickness of each of the data line 64 and the driving voltage line 65 in the direction perpendicular to the base substrate 1" may be in the range of 0.8 to 1.2.

Specifically, the signal line transfer structure 7 includes a widened portion 73. As shown in FIG. 23, orthographic projections of a plurality of via holes VH1 and a plurality of via holes VH3 on the base substrate all fall within an orthographic projection of the widened portion 73 on the base substrate. An orthographic projection of the first edge portion 51 on the base substrate 1 at least partially overlaps with the orthographic projection of the widened portion 73 on the base substrate 1. In this way, the widened portion 73 may be used to cushion the anode and improve the plainness of the anode.

It should be noted that in the embodiments shown in FIG. 23, the plurality of via holes VH1 are arranged in left-right direction, and the plurality of via holes VH3 are arranged in up-down direction. In this way, sizes of the widened portion 73 in both the left-right direction and the up-down direction are widened, which is beneficial to cushion the anode 5 and implement the reliability of via hole connection.

Continuing to refer to FIG. 23, the initializing voltage signal line 660 may be electrically connected to the initializing voltage line 66 through a via hole VH4 to transmit the initializing voltage Vint to the pixel driving circuit. For example, the initializing voltage signal line 660 may be located in the third conductive layer, and the initializing voltage line 66 may be located in the second conductive layer. For example, the number of via holes VH4 may be two, and the two via holes VH4 may be arranged in a direction parallel to the extending direction of the initializing voltage signal line 660, that is, the two via holes is in up-down direction in FIG. 23 (for example, the column direction). It should be understood that the number of via holes VH4 is not limited to two, and more via holes VH4 may also be provided.

Referring to FIGS. 23 and 28 in combination, the second electrode QD5 of the fifth transistor Q5 of the second scan driving circuit may be electrically connected to the signal output line GO through via hole VH5. For example, the number of via holes VH5 may be three, and the three via holes VH5 may be arranged in a direction parallel to the extending direction of the initializing voltage signal line 660, that is, the three via holes VH5 arranged in up-down direction in FIG. 23. It should be understood that the number of via holes VH5 is not limited to three, and more via holes VH5 may also be provided.

The display substrate may further include a second initializing voltage signal line 661. In this case, the initializing voltage signal line 660 may be referred to as a first initializing voltage signal line 660. The second initializing voltage signal line 661 may be located in the same layer as the anode 5. Specifically, referring to FIGS. 23 and 28 in combination, a groove 662 is provided in the first planarization layer 50, and the groove 662 exposes an upper surface of the first initializing voltage signal line 660. A part of the second initializing voltage signal line 661 above the first initializing voltage signal line 660 is located in the groove 662, so that the first initializing voltage signal line 660 and the second initializing voltage signal line 661 may be connected. In this way, the second initializing voltage signal line 661 may be connected in parallel with the first initializing voltage signal line 660 to reduce the resistance on the lines transmitting the initializing voltage.

For example, widths of the first initializing voltage signal line 660 and the second initializing voltage signal line 661 may be approximately equal to each other. A width of the groove 662 may be smaller than the width of the first initializing voltage signal line 660 or the width of the second initializing voltage signal line 661. The width may refer to a size in a direction perpendicular to the extending direction of the first initializing voltage signal line 660 (i.e., the row direction). Exemplarily, the width of the first initializing voltage signal line 660 and the width of the second initializing voltage signal line 661 may be in the range of 15 to 35 microns, and the width of the groove 662 may be in the range of 13 to 30 microns.

Figure 26:
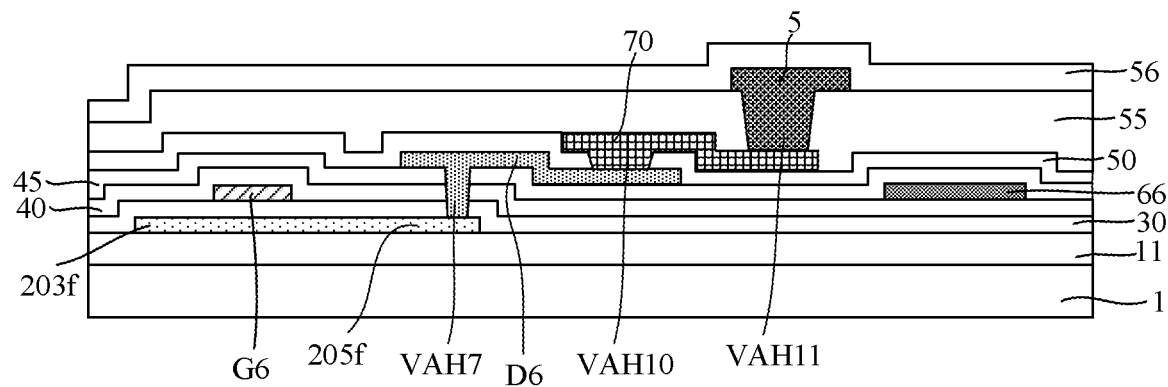
FIG. 26 is a schematic cross-sectional view of the display panel taken along the line HH' in FIG. 23 according to other embodiments of the present disclosure.

Optionally, FIG. 26 is a schematic cross-sectional view of the display panel according to other embodiments of the present disclosure taken along line HH' in FIG. 23, In these embodiments, the display substrate may further include a fourth conductive layer located between the third conductive layer and the layer where the anode 5 is located. For example, the display substrate may further include a connecting conductive portion 70 provided on a side of the first planarization layer 50 away from the base substrate 1. The connecting conductive portion 70 is located in the fourth conductive layer. The connecting conductive portion 70 is electrically connected to the drain electrode D6 through a via hole VAH10, and the anode 5 is electrically connected to the connecting conductive portion 70 through a via hole VAH11. That is, the anode 5 and the drain electrode D6 are electrically connected through the connecting conductive portion 70. In the case where the fourth conductive layer is provided, some of the signal lines may be arranged in the fourth conductive layer according to wiring needs, or a data line connected in parallel with the data line 64 for transmitting the data signal Dm and/or the driving voltage line 65 for transmitting the driving voltage ELVDD may be arranged in the fourth conductive layer, so that the resistance on the lines that transmit data signal and/or driving voltage may be reduced.

Optionally, in FIG. 26, the via hole VAH11 may also be located on left side of the via hole VAH10, for example, the via hole VAH11 is between the via hole VAH10 and the via hole VAH7, that is, an orthographic projection of the via hole VAH11 on the base substrate 1 may be located between an orthographic projection of the via hole VAH10 on the base substrate 1 and an orthographic projection of the via hole VAH7 on the base substrate 1.

Optionally, in the embodiments shown in FIGS. 25, 27, and 28, the first planarization layer 50 is shown in the form of one film layer, but the embodiments of the present disclosure are not limited thereto. In optional embodiments, the first planarization layer 50 may include at least two film layers. For example, two insulating layers may be provided between the third conductive layer and the layer where the anode 5 is located. The two insulating layers may include a passivation layer composed of an inorganic material and a planarization layer composed of an organic material.

Optionally, continuing to refer to FIG. 26, the display substrate may further include a second planarization layer 55 disposed on a side of the connecting conductive portion 70 away from the base substrate 1. The anode 5 of OLED is arranged on a side of the second planarization layer 55 away from the base substrate 1. It should be understood that the OLED may also include an organic light-emission layer and a cathode disposed on a side of the anode 5 away from the base substrate 1.

For example, the first conductive layer and the second conductive layer may be conductive layers made of gate electrode material, such as Mo. For example, the third conductive layer and the fourth conductive layer may be conductive layers composed of source/drain electrode materials, such as Ti/Al/Ti.

For example, the gate electrode material may include metal materials, such as Mo, Al, Cu and other metals as well as alloys thereof. The source/drain electrodes materials may include metal materials, such as Mo, Al, Cu and other metals as well as alloys thereof. The semiconductor material constituting the active layer may include, for example, amorphous silicon, polysilicon, oxide semiconductor, etc, and the oxide semiconductor material may include, for example, IGZO (Indium Gallium Zinc Oxide), ZnO (Zinc Oxide), etc.

Referring to FIG. 23, for convenience of description, the layer where the anode 5 is located is referred to as a fifth conductive layer. The orthographic projection of the third sub-section of signal output line GO3 on the base substrate does not overlap with the orthographic projection of the fifth conductive layer on the base substrate, so as to avoid interference of an electrical signal transmitted on the fifth conductive layer on an output signal of the signal output line GO. For example, the third sub-section of signal output line GO3 is located in the peripheral area, neither the second initializing voltage signal line 661 nor the anode 5 located in the fifth conductive layer overlap with the third sub-section of signal output line G03.

Referring back to FIG. 11 in combination, optionally, the first signal line 31 and the signal line transfer structure 7 may be located in the fourth conductive layer, that is, the first signal line 31 and the signal line transfer structure 7 may be located in the same layer as the connecting conductive portion 70. In this case, the first signal line 31 and the signal line transfer structure 7 may also be composed of the source/drain electrode materials and formed by the same patterning process.

Optionally, the first signal line 31 and the signal line transfer structure 7 may be located in the first conductive layer, that is, the first signal line 31 and the signal line transfer structure 7 may be located in the same layer as the gate electrode G6. In this case, the first signal line 31 and the signal line transfer structure 7 may be composed of the gate electrode material and formed by the same patterning process.

Optionally, the first signal line 31 and the signal line transfer structure 7 may be located in the second conductive layer, that is, the first signal line 31 and the signal line transfer structure 7 may be located in the same layer as the first capacitor electrode Cst1. In this case, the first signal line 31 and the signal line transfer structure 7 may also be made of the gate electrode material and formed by the same patterning process.

In this way, in the embodiments of the present disclosure, the first signal line 31 and the signal line transfer structure 7 are formed of the same material and through the same patterning process, so the first signal line 31 and the signal line transfer structure 7 have the same thickness. Referring to FIG. 11, the first signal line 31 and the signal line transfer structure 7 having the same thickness are respectively located below the anode 5, so that it is beneficial to improving the plainness of the anode 5 and avoiding the slope of the anode 5, thereby improving the color shift of the display substrate.

It should be noted that the planarization layer 4 in the embodiments may include the first planarization layer 50 and the second planarization layer 55 as shown in FIG. 26. However, the embodiments of the present disclosure are not limited to this, and the planarization layer 4 may also have a structure of a single film layer.

It should also be noted that, as described above with respect to FIG. 4, a left GOA circuit DA1 and a right GOA circuit DA2 are provided on the display substrate according to some embodiments. Correspondingly, the at least one array of edge sub-pixels may include a column of edge sub-pixels located on the left side of the display area and a column of edge sub-pixels located on the right side of the display area. A plurality of the signal line transfer structures 7 are provided between the GOA circuit DA1 on the left side and a column of edge sub-pixels on the left side of the display area, and orthographic projections of first electrodes of a column of edge sub-pixels on the left side of the display area on the base substrate at least partially overlap with orthographic projections of the signal line transfer structures 7 on the base substrate, respectively. Similarly, a plurality of the signal line transfer structures 7 are also provided between the right GOA circuit DA2 and a column of edge sub-pixels located on the right side of the display area, and orthographic projections of first electrodes of a column of edge sub-pixels located on the right side of the display area on the base substrate at least partially overlap with orthographic projections of the signal line transfer structures 7 on the base substrate, respectively.

In the above-mentioned embodiments, the signal line transfer structures 7 are arranged at edge positions on the left and right sides of the display area AA to cushion the anodes 5. However, the embodiments of the present disclosure are not limited to this. The signal line transfer structures 7 may also be arranged at other positions, for example, at edge positions of upper and lower sides of the display area AA, or at edge positions of corners of the display area AA.

Some embodiments of the present disclosure further provide a display panel including the display substrate as described above. For example, the display panel may be an OLED display panel.

Figure 29:
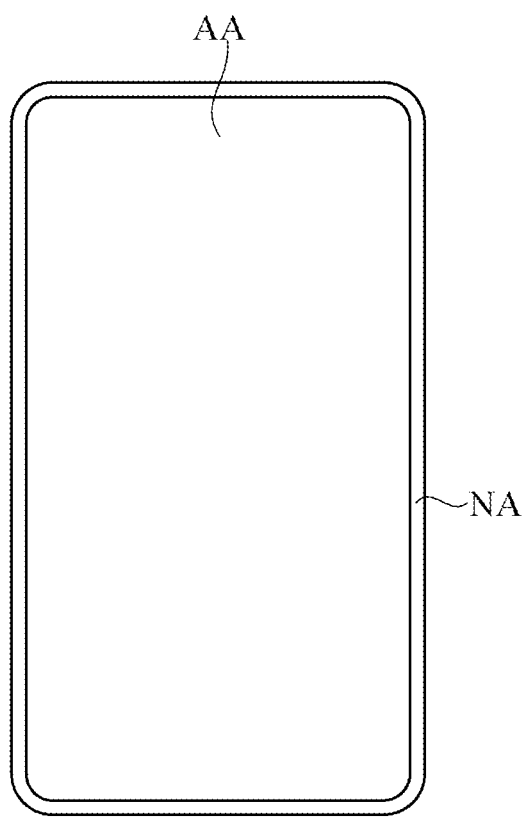
FIG. 29 is a schematic view of a display device according to some embodiments of the present disclosure.

Referring to FIG. 29, some embodiments of the present disclosure also provide a display device. The display device may include the display substrate as described above. The display device includes a display area AA and a non-display area NA, and the non-display area NA has a relatively small width, thereby realizing a display device with a narrow frame.

The display device may include any device or product with a display function. For example, the display device may be a smart phone, a mobile phone, an e-book reader, a desktop computer (PC), a laptop PC, a netbook PC, a personal digital assistant (PDA), a portable multimedia player (PMP), digital audio players, mobile medical devices, cameras, wearable devices (such as head-mounted devices, electronic clothing, electronic bracelets, electronic necklaces, electronic accessories, electronic tattoos, or smart watches), televisions, etc.

It should be understood that the display device according to the embodiments of the present disclosure has all the characteristics and advantages of the above-mentioned display substrate. For details, please refer to the above description, which will not be repeated here.

Although some embodiments of the general technical concept of the present disclosure have been shown and described, those of ordinary skill in the art will understand that changes can be made to these embodiments without departing from the principle and spirit of the general technical concept. The scope of the present disclosure shall be defined by the claims and their equivalents.

What is claimed is:

1. A display substrate, the display substrate comprising a display area and a non-display area, wherein the display substrate comprises:
   a base substrate;
   a plurality of sub-pixels in the display area, wherein the plurality of sub-pixels are arranged on the base substrate in an array in a row direction and a column direction, each sub-pixel comprises a light-emission device, and the light-emission device comprises a first electrode;
   a plurality of signal lines on the base substrate, wherein the plurality of signal lines comprise at least a first signal line and a second signal line, the first signal line is configured to transmit a voltage signal, and the second signal line is configured to transmit a scan signal;
   a signal line lead on the base substrate, wherein the signal line lead is located in the non-display area; and
   a signal line transfer structure on the base substrate, wherein the signal line transfer structure is configured to connect the signal line lead and the second signal line,
   wherein the signal line transfer structure and the first signal line are located in the same layer, and the signal line transfer structure is spaced apart from the first signal line; and
   wherein an orthographic projection of the first electrode of at least one of the sub-pixels on the base substrate at least partially overlaps with an orthographic projection of the first signal line on the base substrate, and the orthographic projection of the first electrode of at least one of the sub-pixels on the base substrate at least partially overlaps with an orthographic projection of the signal line transfer structure on the base substrate.

2. The display substrate of claim 1, wherein the plurality of sub-pixels comprise at least one array of edge sub-pixels at an edge position of the display area close to the non-display area; and
   an orthographic projection of the first electrode of each edge sub-pixel in the at least one array of edge sub-pixels on the base substrate at least partially overlaps with the orthographic projection of the first signal line on the base substrate, and the orthographic projection of the first electrode of each edge sub-pixel in the at least one array of edge sub-pixels on the base substrate at least partially overlaps with the orthographic projection of the signal line transfer structure on the base substrate.

3. The display substrate of claim 2, wherein the at least one array of edge sub-pixels comprise at least one column of edge sub-pixels, and the at least one column of edge sub-pixels are arranged in a direction that is substantially the same as an extending direction of the first signal line.

4. The display substrate of claim 2, wherein an extending direction of the signal line transfer structure and the extending direction of the first signal line are substantially the same, and the plurality of signal line transfer structures are arranged in the direction that is substantially the same as the extending direction of the first signal line.

5. The display substrate of claim 2, wherein an orthographic projection of the signal line transfer structure, overlapping with an edge sub-pixel in the at least one array of edge sub-pixels, on the base substrate passes through an orthographic projection of the first electrode of the edge sub-pixel on the base substrate.

6. The display substrate of claim 2, wherein the first electrode of each edge sub-pixel in the at least one array of edge sub-pixels comprises a first edge portion close to the non-display area, and an orthographic projection of the first edge portion on the base substrate at least partially overlaps with the orthographic projection of the signal line transfer structure on the base substrate, and
   in a direction perpendicular to the first signal line, the signal line transfer structure is located on a side of the first signal line close to the non-display area.

7. The display substrate of claim 6, wherein the first electrode of each edge sub-pixel in the at least one array of edge sub-pixels comprises a second edge portion away from the non-display area, and an orthographic projection of the second edge portion on the base substrate at least partially overlaps with the orthographic projection of the first signal line on the base substrate.

8. The display substrate of claim 7, wherein the display substrate further comprises a gate driving circuit arranged on the base substrate and located in the non-display area, the signal line lead comprises a signal output line of the gate driving circuit, the signal output line is configured to output a gate scan signal, and the second signal line comprises a scan signal line for transmitting the gate scan signal.

9. The display substrate of claim 8, wherein the display substrate further comprises an initializing voltage signal line arranged on the base substrate and located in the non-display area, the signal output line is electrically connected to the signal line transfer structure through a plurality of third via holes, and the plurality of third via holes are arranged in a direction parallel to an extending direction of the initializing voltage signal line.

10. The display substrate of claim 9, wherein the scan signal line is electrically connected to the signal line transfer structure through a plurality of fourth via holes, and the plurality of fourth via holes are arranged in a direction perpendicular to the extending direction of the initializing voltage signal line.

11. The display substrate of claim 10, wherein the signal line transfer structure comprises a widened portion, orthographic projections of the plurality of third via holes and orthographic projections of the plurality of fourth via holes on the base substrate all fall within an orthographic projection of the widened portion on the base substrate; and
   an orthographic projection of the first edge portion of the first electrode on the base substrate at least partially overlaps with the orthographic projection of the widened portion of the signal line transfer structure on the base substrate, or,
   wherein the first signal line comprises a driving voltage line for transmitting a driving voltage, and an orthographic projection of the second edge portion of the first electrode on the base substrate at least partially overlaps with an orthographic projection of the driving voltage line on the base substrate, or,
   wherein the first signal line further comprises a data line for transmitting a data signal, and the orthographic projection of the second edge portion of the first electrode on the base substrate also at least partially overlaps with an orthographic projection of the data line on the base substrate, or,
   wherein the scan signal line is located in the first conductive layer, the signal output line is located in the second conductive layer, and the signal line transfer structure is located in the third conductive layer, or,
   wherein the display substrate further comprises a reset control signal line on the base substrate, the reset control signal line is electrically connected to the signal line transfer structure through a plurality of fifth via holes, and the plurality of fifth via holes are arranged in a direction perpendicular to the extending direction of the initializing voltage signal line.

12. The display substrate of claim 10, wherein the signal output line comprises a first sub-section of signal output line, a second sub-section of signal output line, and a third sub-section of signal output line that are sequentially connected, an orthographic projection of the first sub-section of signal output line on the base substrate falls within the orthographic projection of the signal line transfer structure on the base substrate, an orthographic projection of the second sub-section of signal output line on the base substrate at least partially overlaps with an orthographic projection of the initializing voltage signal line on the base substrate, and the third sub-section of signal output line is located on a side of the initializing voltage signal line away from the signal line transfer structure; and
   in a direction parallel to the extending direction of the initializing voltage signal line, a size of the second sub-section of signal output line is smaller than a size of the first sub-section of signal output line, and the size of the first sub-section of signal output line is smaller than a size of the third sub-section of signal output line.

13. The display substrate of claim 12, wherein the second capacitor electrode comprises a second capacitor electrode body portion and a second capacitor electrode connecting portion, and the second capacitor electrode connecting portion is located between two adjacent second capacitor electrode body portions; and
   a projection of the second sub-section of signal output line in the direction perpendicular to the extending direction of the initializing voltage signal line at least partially overlaps with a projection of the second capacitor electrode connecting portion in the direction perpendicular to the extending direction of the initializing voltage signal line.

14. The display substrate of claim 1, further comprising a pixel defining layer on a side of the first electrode away from the base substrate, wherein the pixel defining layer comprises an opening, the first electrode of the at least one sub-pixel is at least partially exposed by the opening, and a size of the signal line transfer structure in the column direction is greater than a size of the opening of the pixel defining layer corresponding to the at least one sub-pixel in the column direction.

15. The display substrate of claim 1, wherein a size of a pixel driving circuit corresponding to the at least one sub-pixel in the column direction is marked as a, and the size of the signal line transfer structure in the column direction is between ⅓a and a.

16. The display substrate of claim 1, wherein the first electrode comprises a body portion, and an orthographic projection of the body portion on the base substrate has a regular shape; and
   the orthographic projection of the first signal line on the base substrate and the orthographic projection of the signal line transfer structure on the base substrate are respectively located on two sides of a center of the orthographic projection of the body portion of the first electrode on the base substrate, and
   a thickness of the signal line transfer structure in a direction perpendicular to the base substrate is substantially equal to a thickness of the first signal line in the direction perpendicular to the base substrate.

17. The display substrate of claim 1, wherein each sub-pixel further comprises a pixel driving circuit, the pixel driving circuit comprises a storage capacitor and at least one thin film transistor, each thin film transistor comprises a semiconductor layer, a gate electrode, a source electrode and a drain electrode, and the storage capacitor comprises a first capacitor electrode and a second capacitor electrode; and
   wherein the display substrate further comprises:
      a first conductive layer on a side of the semiconductor layer away from the base substrate, wherein the gate electrode and the first capacitor electrode are located in the first conductive layer;
      a second conductive layer on a side of the first conductive layer away from the base substrate, wherein the second capacitor electrode is located in the second conductive layer; and
      a third conductive layer on a side of the second conductive layer away from the base substrate, wherein the source electrode and the drain electrode are located in the third conductive layer.

18. The display substrate of claim 17, wherein the display substrate further comprises a conductive connecting portion between the third conductive layer and a layer where the first electrode is located, and the conductive connecting portion is configured to electrically connect one of the source electrode and the drain electrode with the first electrode.

19. The display substrate of claim 1, wherein at least one of the signal line lead and the second signal line is located in a layer different from a layer where the signal line transfer structure is located.

20. The display substrate of claim 19, wherein the signal line lead and the second signal line are located in the same layer, both the signal line lead and the second signal line are located in a layer different from a layer where the signal line transfer structure is located; the display substrate further comprises an insulating layer between a layer where both the signal line lead and the second signal line are located and the layer where the signal line transfer structure is located, and the insulating layer comprises a first via hole and a second via hole; a part of the signal line transfer structure is connected to the second signal line through a first conductive plug in the first via hole, another part of the signal line transfer structure is connected to the signal line lead through a second conductive plug in the second via hole; or, the signal line lead and the second signal line are located in different layers, and the signal line lead and the signal line transfer structure are located in the same layer; the display substrate further comprises an insulating layer between a layer where both the signal line lead and the signal line transfer structure are located and a layer where the second signal line is located, and the insulating layer comprises a first via hole; a part of the signal line transfer structure is connected to the second signal line through a first conductive plug in the first via hole, and another part of the signal line transfer structure is directly connected to the signal line lead; or, the signal line lead and the second signal line are located in different layers, and the second signal line and the signal line transfer structure are located in the same layer; the display substrate further comprises an insulating layer between a layer where both the second signal line and the signal line transfer structure are located and a layer where the signal line lead is located, and the insulating layer comprises a second via hole; a part of the signal line transfer structure is directly connected to the second signal line, and another part of the signal line transfer structure is connected to the signal line lead through a second conductive plug in the second via hole.

21. A display panel comprising the display substrate of claim 1.

\* \* \* \* \*